US008988072B2

(12) United States Patent
Ausserlechner

(10) Patent No.: US 8,988,072 B2
(45) Date of Patent: Mar. 24, 2015

(54) VERTICAL HALL SENSOR WITH HIGH ELECTRICAL SYMMETRY

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 754 days.

(21) Appl. No.: 13/187,970

(22) Filed: Jul. 21, 2011

(65) Prior Publication Data

US 2013/0021027 A1    Jan. 24, 2013

(51) Int. Cl.
G01R 33/07 (2006.01)
G01B 7/30 (2006.01)
H01L 43/06 (2006.01)

(52) U.S. Cl.
CPC ............ *G01R 33/075* (2013.01); *G01R 33/077* (2013.01); *H01L 43/06* (2013.01)
USPC ........................ 324/251; 324/207.22; 324/249

(58) Field of Classification Search
USPC ........................... 324/251, 207.2, 207.22, 249
See application file for complete search history.

(56) References Cited

U.S. PATENT DOCUMENTS

| 3,823,354 | A  | 7/1974  | Janssen          |
| 4,141,026 | A  | 2/1979  | Bate et al.      |
| 4,667,391 | A  | 5/1987  | Chapuy et al.    |
| 4,829,352 | A  | 5/1989  | Popovic et al.   |
| 5,572,058 | A  | 11/1996 | Biard            |
| 5,880,586 | A  | 3/1999  | Dukart et al.    |
| 6,008,643 | A  | 12/1999 | Mani et al.      |
| 6,542,068 | B1 | 4/2003  | Drapp et al.     |
| 6,590,389 | B1 | 7/2003  | Shibasaki et al. |
| 6,768,301 | B1 | 7/2004  | Hohe et al.      |
| 7,511,484 | B2 | 3/2009  | Oohira et al.    |
| 7,782,050 | B2 | 8/2010  | Ausserlechner et al. |
| 7,872,322 | B2 | 1/2011  | Schott et al.    |
| 2006/0011999 | A1 | 1/2006 | Schott et al.   |
| 2007/0029999 | A1 | 2/2007 | Middelhoek et al. |

(Continued)

FOREIGN PATENT DOCUMENTS

DE    102011101604 A1    12/2011
EP    0503141 A1    9/1992

(Continued)

OTHER PUBLICATIONS

R.S. Popovic, "Hall Devices for Magnetic Sensor Microsystems", IEEE 1997 International Conference on Solid-State Sensors and Actuators, Chicago, Jun. 16-19, 1997, p. 377-380.

(Continued)

*Primary Examiner* — Reena Aurora
(74) *Attorney, Agent, or Firm* — Eschweiler & Associates, LLC

(57) ABSTRACT

A vertical Hall sensor includes a Hall effect region and a plurality of contacts formed in or on a surface of the Hall effect region. The plurality of contacts are arranged in a sequence along a path extending between a first end and a second end of the Hall effect region. The plurality of contacts includes at least four spinning current contacts and at least two supply-only contacts. The spinning current contacts are configured to alternatingly function as supply contacts and sense contacts according to a spinning current scheme. The at least four spinning current contacts are arranged along a central portion of the path. The at least two supply-only contacts are arranged on both sides of the central portion in a distributed manner and are configured to supply electrical energy to the Hall effect region according to an extension of the spinning current scheme.

24 Claims, 23 Drawing Sheets

(56) References Cited

U.S. PATENT DOCUMENTS

| | | |
|---|---|---|
| 2009/0121707 A1 | 5/2009 | Schott |
| 2009/0256559 A1 | 10/2009 | Ausserlechner et al. |
| 2010/0019331 A1 | 1/2010 | Kilian |
| 2010/0123458 A1 | 5/2010 | Schott |
| 2010/0133632 A1 | 6/2010 | Schott |
| 2010/0164491 A1 | 7/2010 | Kejik et al. |
| 2013/0015853 A1 | 1/2013 | Raz et al. |

FOREIGN PATENT DOCUMENTS

| | | |
|---|---|---|
| EP | 0704710 A1 | 4/1996 |
| EP | 0947846 A2 | 10/1999 |
| EP | 1436849 A2 | 7/2004 |
| EP | 1438755 A2 | 7/2004 |
| JP | 58154263 A | 9/1983 |
| JP | S6327075 A | 2/1988 |
| WO | 03036732 A2 | 5/2003 |
| WO | 03036733 A2 | 5/2003 |
| WO | 2004025742 A1 | 3/2004 |
| WO | 2006074989 A2 | 7/2006 |
| WO | 2008145662 A1 | 12/2008 |

OTHER PUBLICATIONS

Ch. Schott, et al., "Linearizing Integrated Hall Devices", IEEE 1997 International Conference on Solid-State Sensors and Actuators, Chicago, Jun. 16-19, 1997, p. 393-396.

U.S. Appl. No. 13/400,214, filed Feb. 20, 2012. 58 Pages, Vertical Hall device with electrical 180 degree symmetry.

Non-Final Office Action dated Dec. 6, 2013 for U.S. Appl. No. 13/400,214. 32 Pages.

Office Action Dated May 14, 2014 U.S. Appl. No. 13/187,935.

U.S. Appl. No. 13/187,935, filed Jul. 21, 2011. 54 Pages, Electronic device with ring-connected Hall effect regions.

Popovic, R.S. "Hall Devices for Magnetic Sensor Microsystems." Swiss Federal Institute of Technology at Lausanne, EPFL-DMT-IMS, Lausanne, Switzerland. 4 Pages, 1997.

Final Office Action Dated Aug. 14, 2014 U.S. Appl. No. 13/400,214.

Notice of Allowance Dated Dec. 15, 2014 U.S. Appl. No. 13/187,935.

Non Final Office Action Dated Dec. 29, 2014 U.S. Appl. No. 13/400,214.

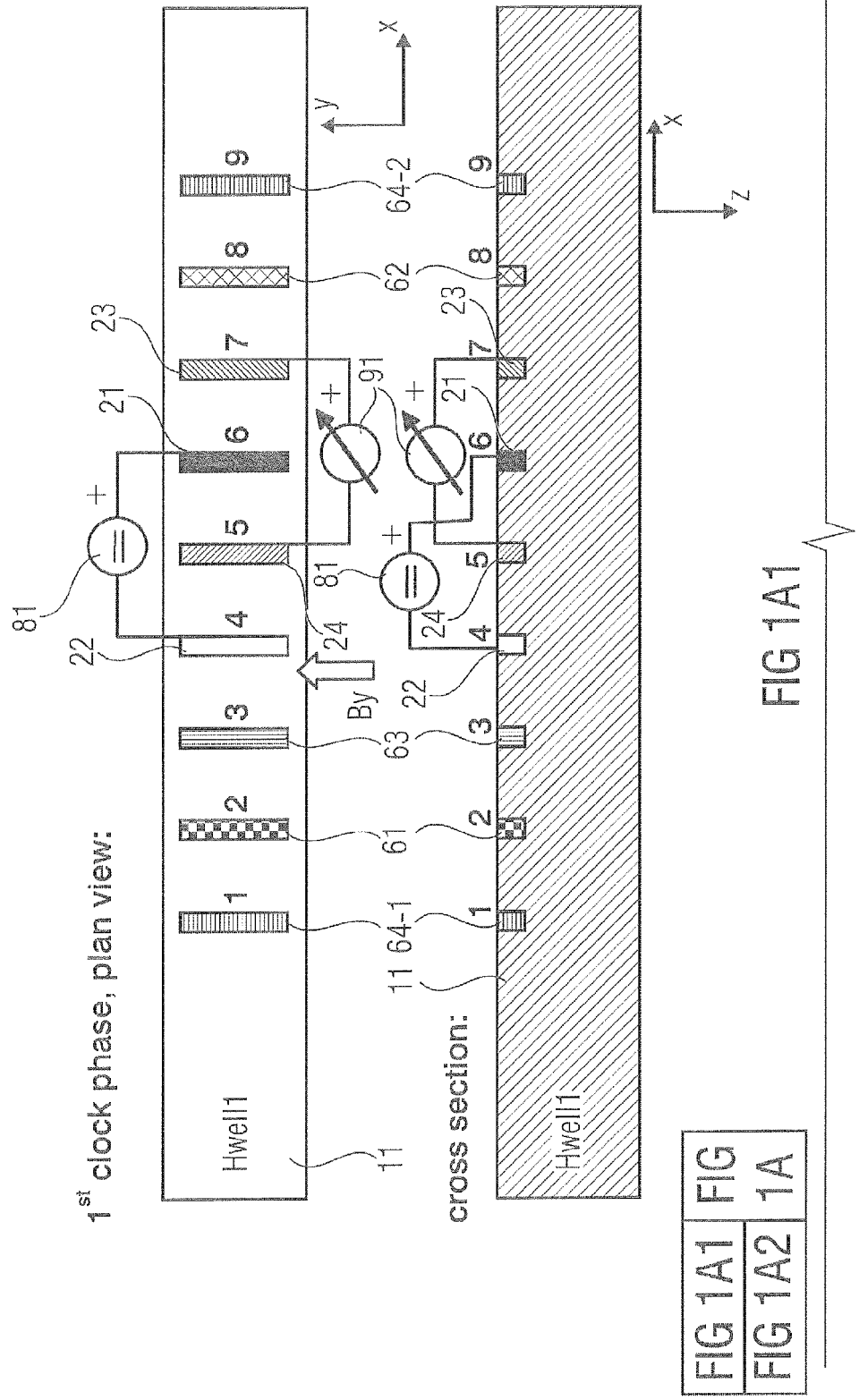

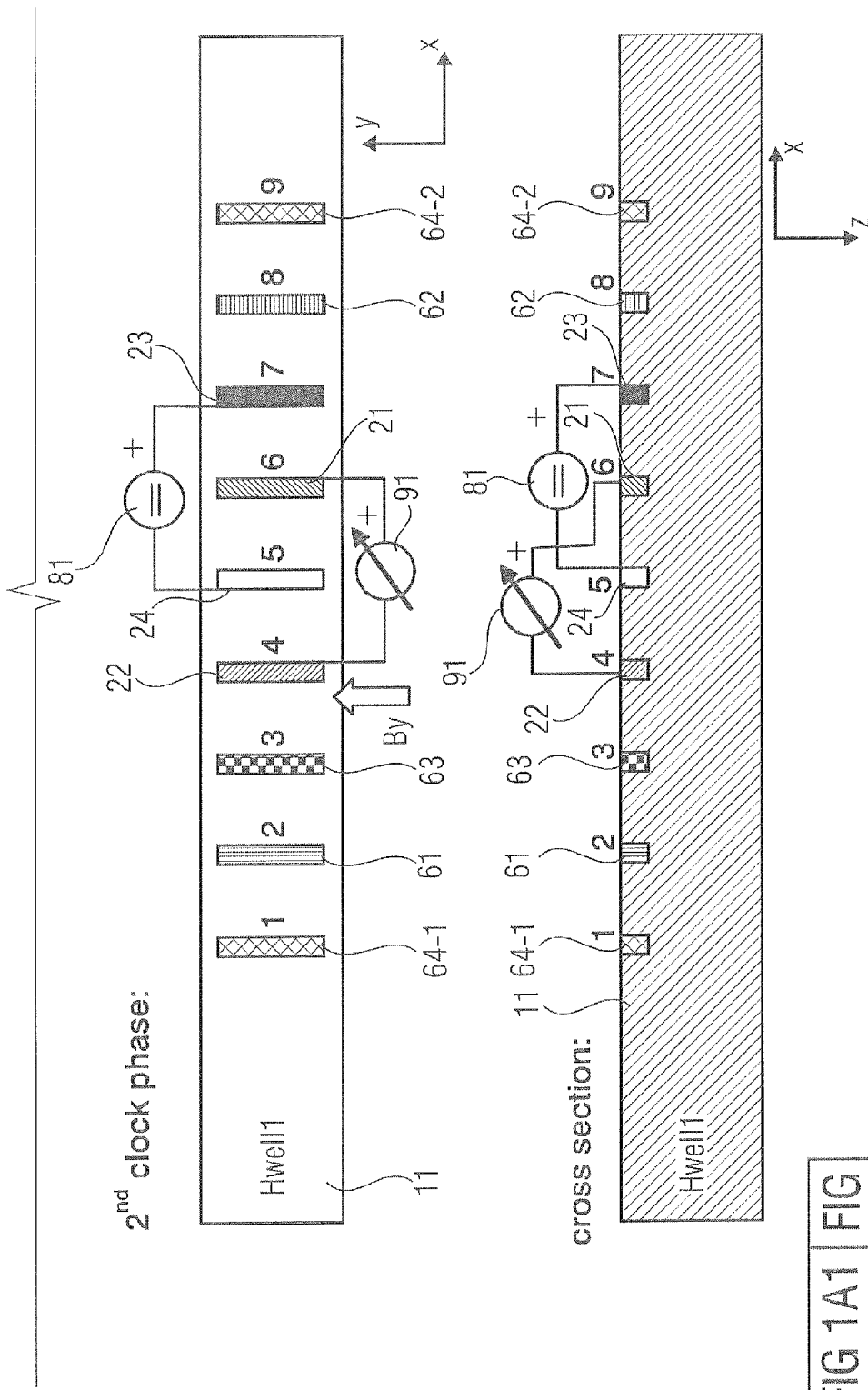

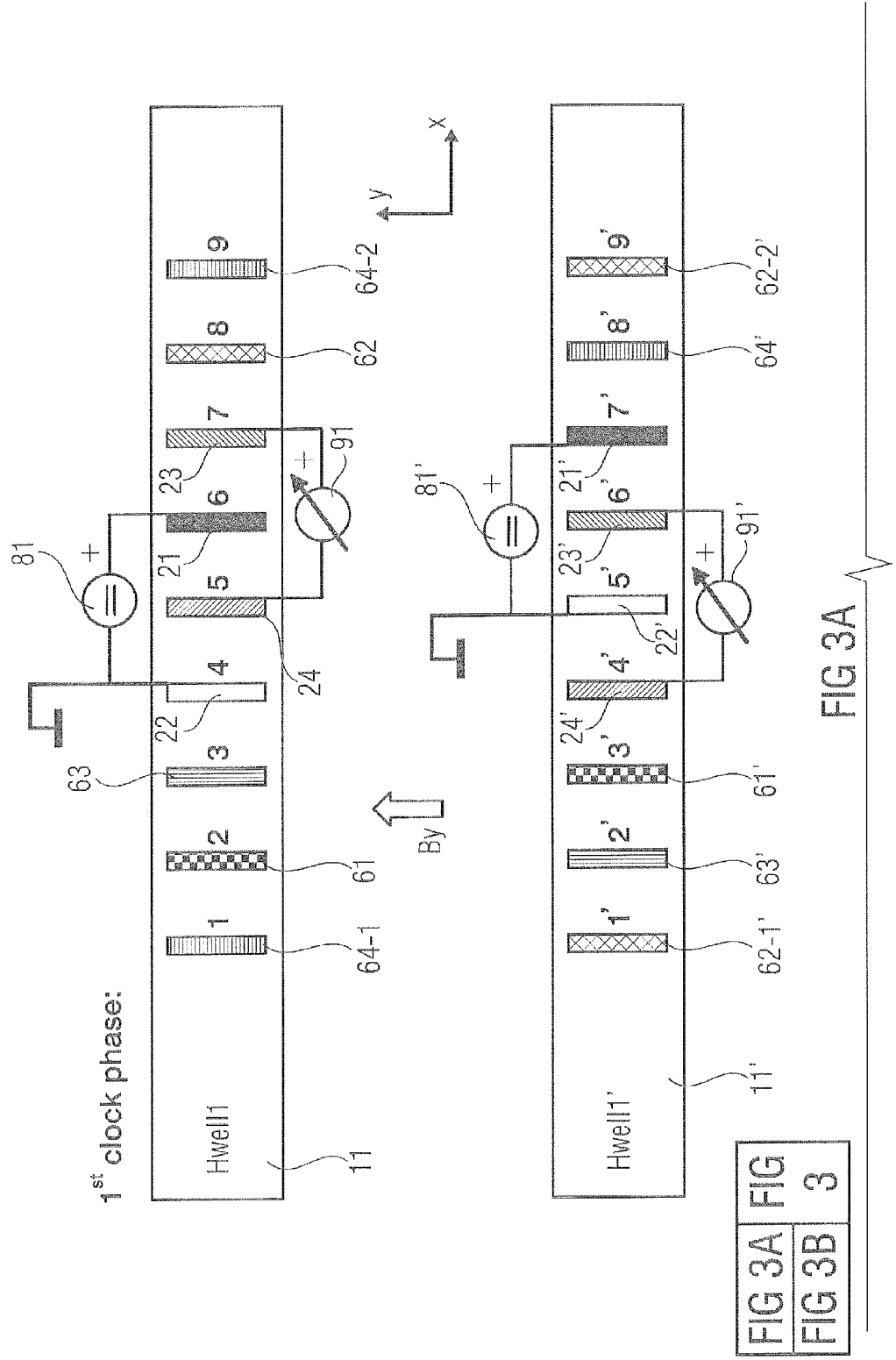

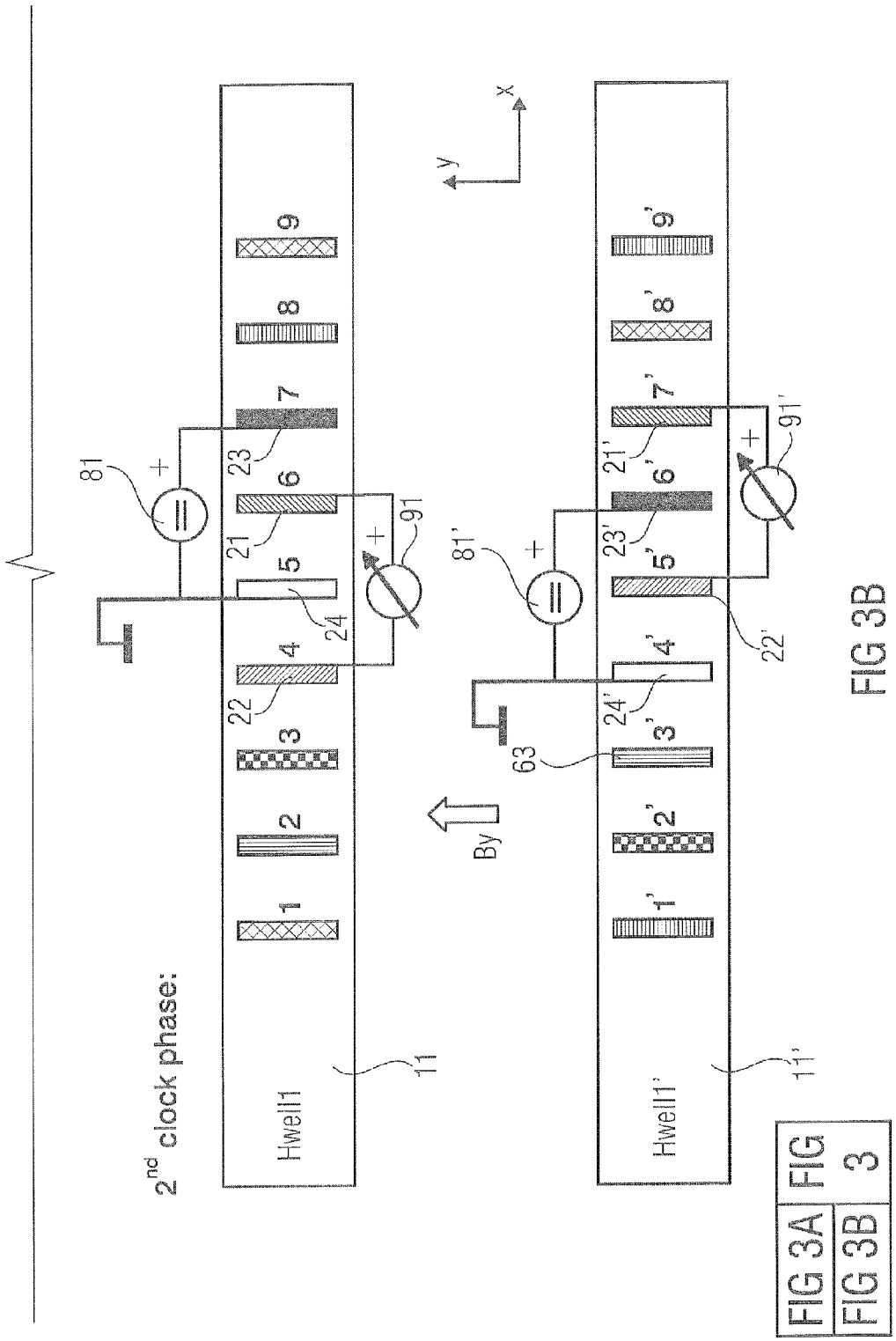

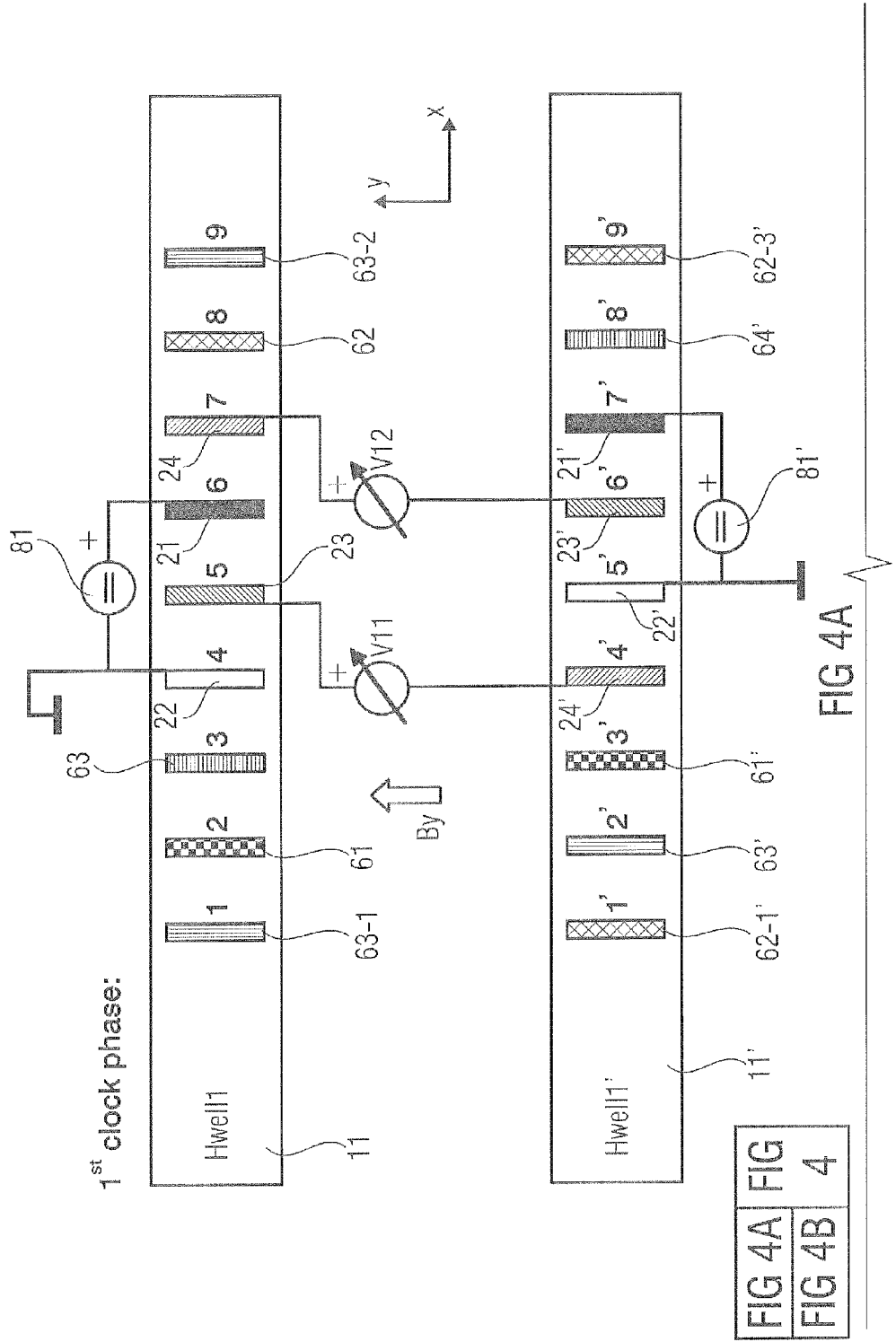

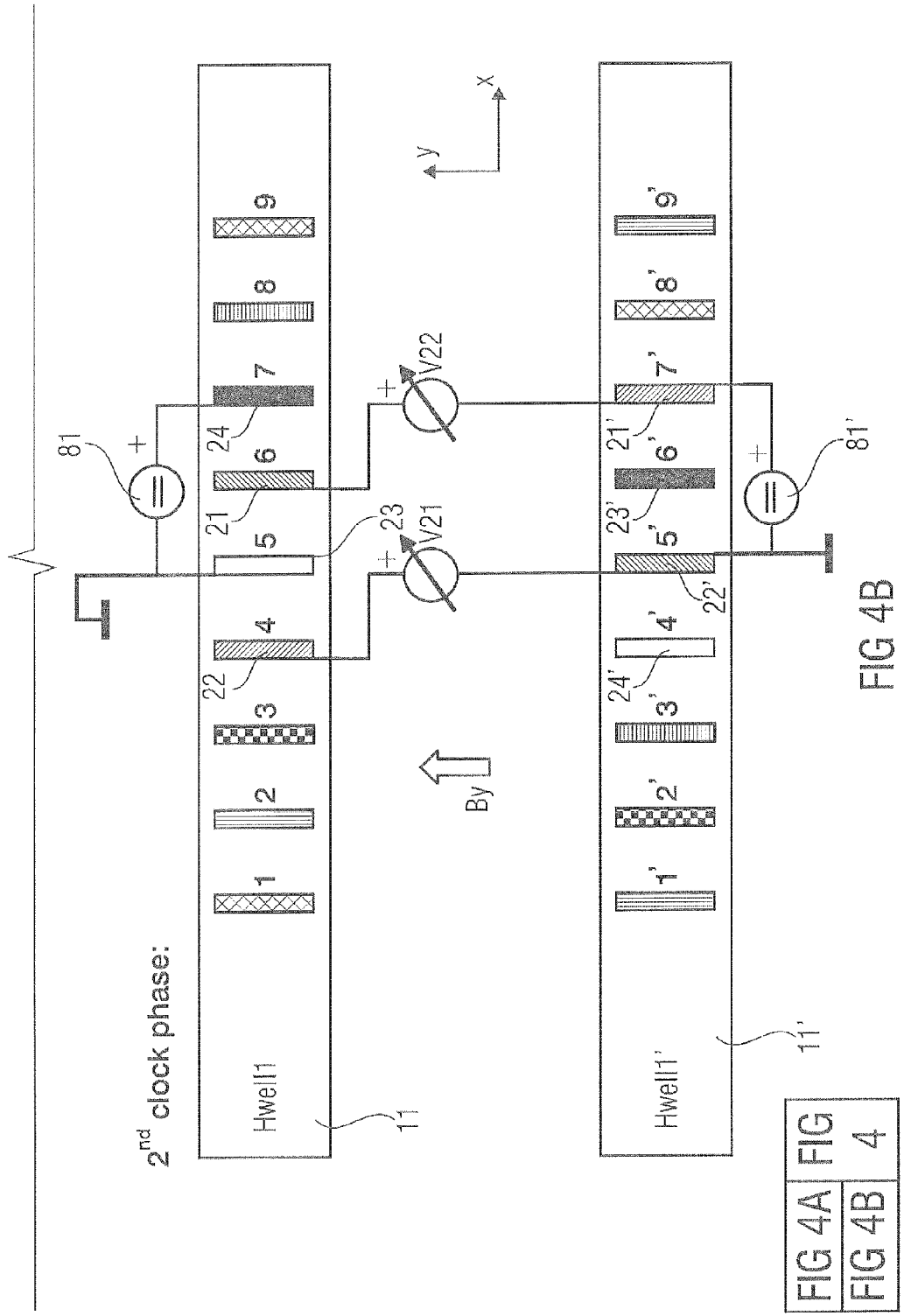

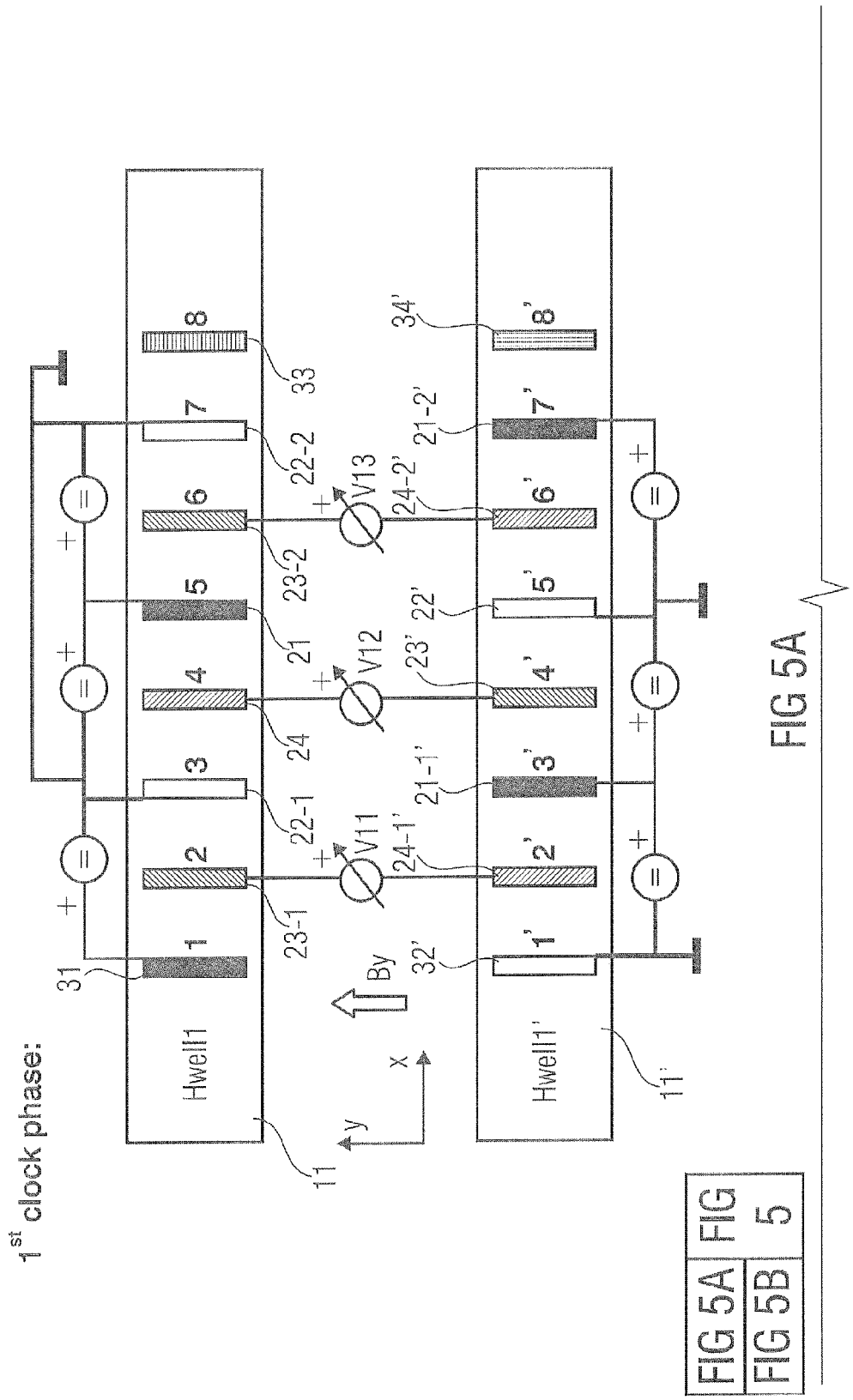

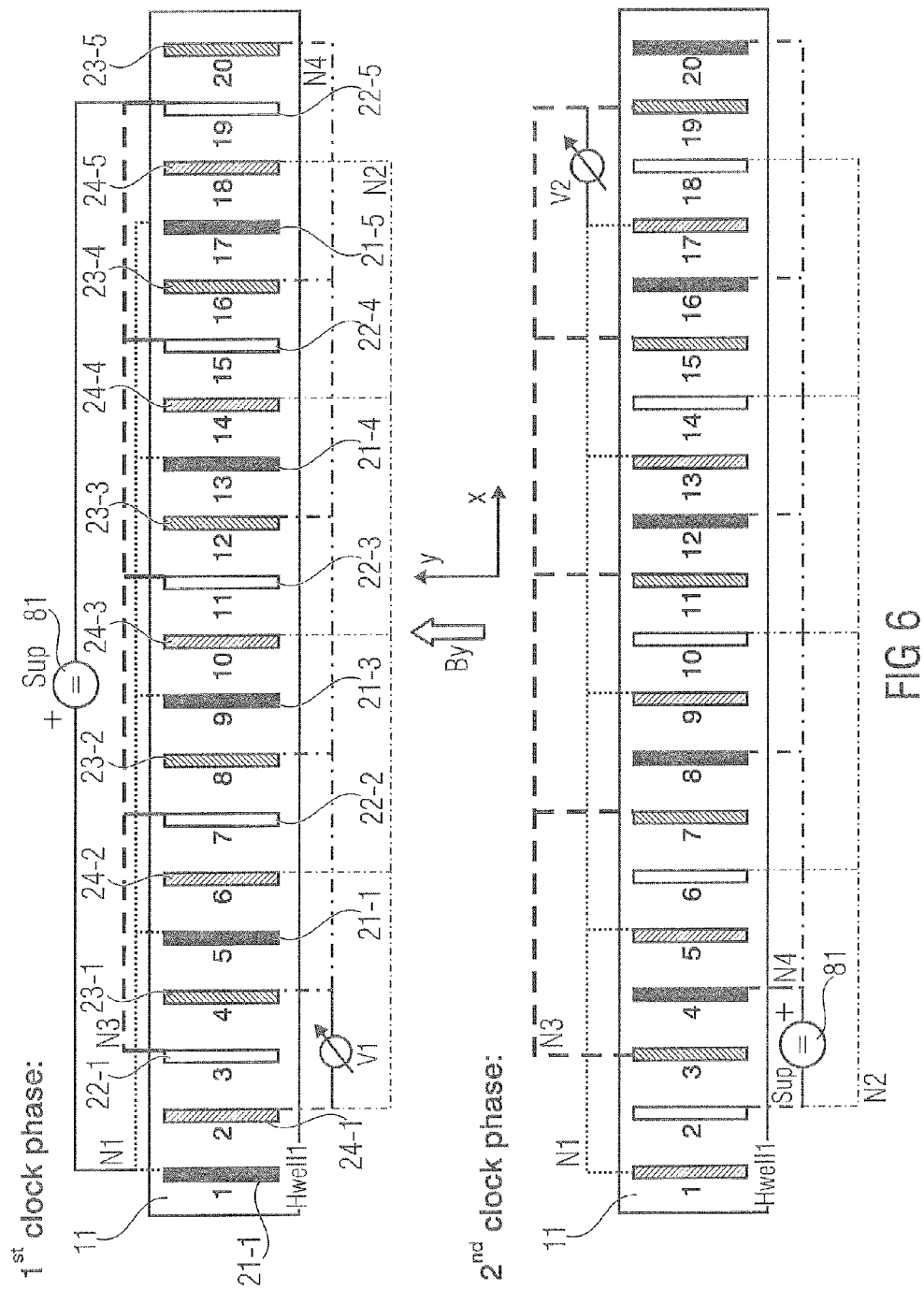

VERTICAL HALL SENSOR WITH HIGH ELECTRICAL SYMMETRY

RELATED APPLICATION

This application is related to U.S. Ser. No. 13/187,935 filed on Jul. 21, 2011 entitled "ELECTRONIC DEVICE WITH RING-CONNECTED HALL EFFECT REGIONS".

FIELD OF THE INVENTION

Embodiments of the present invention relate to a vertical Hall sensor and to a magnetic sensing method using a vertical Hall sensor.

BACKGROUND OF THE INVENTION

In order to sense or measure the strength and direction of a magnetic field parallel to the surface of, e.g., a semiconductor die, vertical Hall devices may be used. Most vertical Hall devices suffer from the fact that the spinning current method, which is used to cancel the zero-point error of the Hall devices, does not work very well. With known methods of the spinning current scheme, it is possible to obtain residual zero-point errors of about 1 mT. A reason for this rather poor offset behavior can be found in the asymmetry of the vertical Hall device. Although it is known how to connect four vertical Hall devices in order to improve the symmetry, the contact resistances may still cause residual asymmetries.

SUMMARY

Embodiments of the present invention provide a vertical Hall sensor that comprises a Hall effect region and a plurality of contacts formed in or on a surface of the Hall effect region. The contacts are arranged in a sequence along a path extending between a first and a second end of the Hall effect region. The plurality of contacts comprise at least four spinning current contacts and at least two supply-only contacts. The spinning current contacts are configured to alternatingly function as a supply contact and a sensor contact according to a spinning current scheme. The at least four spinning current contacts are arranged along a central portion of the path. The at least two supply-only contacts are arranged on both sides of the central portion in a distributed manner and are configured to supply electrical energy to the Hall effect region according to an extension of the spinning current scheme for supplying electrical energy to the Hall effect region.

Further embodiments of the present invention provide a vertical Hall sensor comprising a Hall effect region and a plurality of contacts formed in or on a Hall effect region in a sequence along a path extending between a first end and a second end of the Hall effect region. The contacts are consecutively numbered according to the sequence. The plurality of contacts comprises first type contacts and second type contacts, wherein M second type contacts are arranged between every two first type contacts, M being a positive integer. First type contacts having ordinal numbers within the sequence given by $1+i*4*(1+M)$, $i=0, 1, 2 \ldots$ are connected to a first node N1. First type contacts having ordinal numbers within the sequence given by $2+M+i*4*(1+M)$, $i=0, 1, 2 \ldots$ are connected to a second node N2. First type contacts having ordinal numbers within the sequence given by $3+2*M+i*4*(1+M)$, $i=0, 1, 2 \ldots$ are connected to a third node N3. Finally, first type contacts having ordinal numbers within the sequence given by $4+3*M+i*4*(1+M)$, $i=0, 1, 2 \ldots$ are connected to a fourth node N4. The first type contacts are considered to alternatingly function as supply contacts and as sense contacts according to a spinning current scheme with provision to supply electrical energy between the first and third nodes N1, N3 in a first operating phase of the spinning current scheme and between the second and fourth nodes N2, N4 in a second operating phase. The first type contacts are also configured to sense a sense signal between the second and fourth nodes N2, N4 in the first operating phase and to sense another sense signal between the first and third nodes N1, N3 in the second operating phase. The second type contacts are floating contacts.

Further embodiments of the present invention provide a vertical Hall sensor comprising a Hall effect region and a plurality of contacts formed in or on a surface of the Hall effect region. The Hall effect region has a first end and a second end. The Hall effect region is symmetric with respect to a symmetry axis such that the first and the second ends are mirror-inverted to each other with respect to the symmetry axis. The plurality of contacts are formed in a symmetrical manner with respect to the symmetry axis. The contacts are arranged in a sequence along a path extending between the first end and the second end of the Hall effect region. The plurality of contacts comprises at least four spinning current contacts and at least two supply-only contacts. The spinning current contacts are configured to alternatingly function as supply contacts and as sensor contacts according to the spinning current scheme. The at least four spinning current contacts are closer to the symmetry axis than the supply-only contacts. The at least two supply-only contacts are configured to supply electrical energy to the Hall effect region such that boundary effects affecting an electric current flow within the Hall effect region during an execution of a spinning current scheme are reduced, the boundary effects being caused by at least one of the first and second ends.

Furthermore, embodiments of the present invention provide a magnetic sensing method which comprises connecting a power supply between a spinning current contact and a supply-only contact, sensing a sense signal, swapping the functions of the spinning current contacts, sensing another sense signal, and determining an output signal. The spinning current contact is configured to alternatingly function as a supply contact and as a sense contact according to the spinning current scheme. The spinning current contact and the sense contact belong to a plurality of contacts formed in or on a surface of a Hall effect region of a vertical Hall sensor. The plurality of contacts comprises at least four spinning current contacts and at least two supply-only contacts. The contacts are arranged in a sequence along a path extending between a first end and a second end of the Hall effect region, wherein the at least four spinning current contacts are arranged along a central portion of the path. The at least two supply-only contacts are arranged on both sides of the central portion in a distributed manner and are configured to supply electrical energy to the Hall effect region according to an extension of the spinning current scheme for supplying electrical energy to the Hall effect region. The action of sensing a sense signal is performed between at least two spinning current contacts currently functioning as sense contacts. The action of swapping the functions of the spinning current contacts has the effect that the electrical energy is now supplied to the Hall effect region via the spinning current contacts having previously functioned as sense contacts and at least one other supply-only contact different from the supply-only contact used before. The other sense signal is sensed between two spinning current contacts other than the ones used previously. The output signal is determined on the basis of the sense signals.

BRIEF DESCRIPTION OF THE DRAWINGS

Embodiments of the present invention are described herein, making reference to the appended drawings.

FIG. 1a shows a schematic plan view and a corresponding schematic cross section of a vertical Hall sensor during a first operating phase (top) and a second operating phase (bottom) of a spinning current scheme;

FIG. 1b shows a schematic plan view of a vertical Hall sensor using one supply contact more in the first and second operating phase than the vertical Hall sensor shown in FIG. 1a;

FIG. 3 shows schematic plan views of a vertical Hall device having two Hall effect regions in a first and a second operating phase, respectively;

FIG. 4 shows schematic plan views of another vertical Hall sensor having two Hall effect regions in a first and a second operating phase, respectively;

FIG. 6 shows schematic plan views of vertical Hall sensors in a first and a second operating phase, respectively;

FIG. 12b shows a schematic cross-section of the vertical Hall device shown in FIG. 12a;

FIG. 12c shows another schematic cross-section of the vertical Hall device shown in FIG. 12a;

Figure 1B:
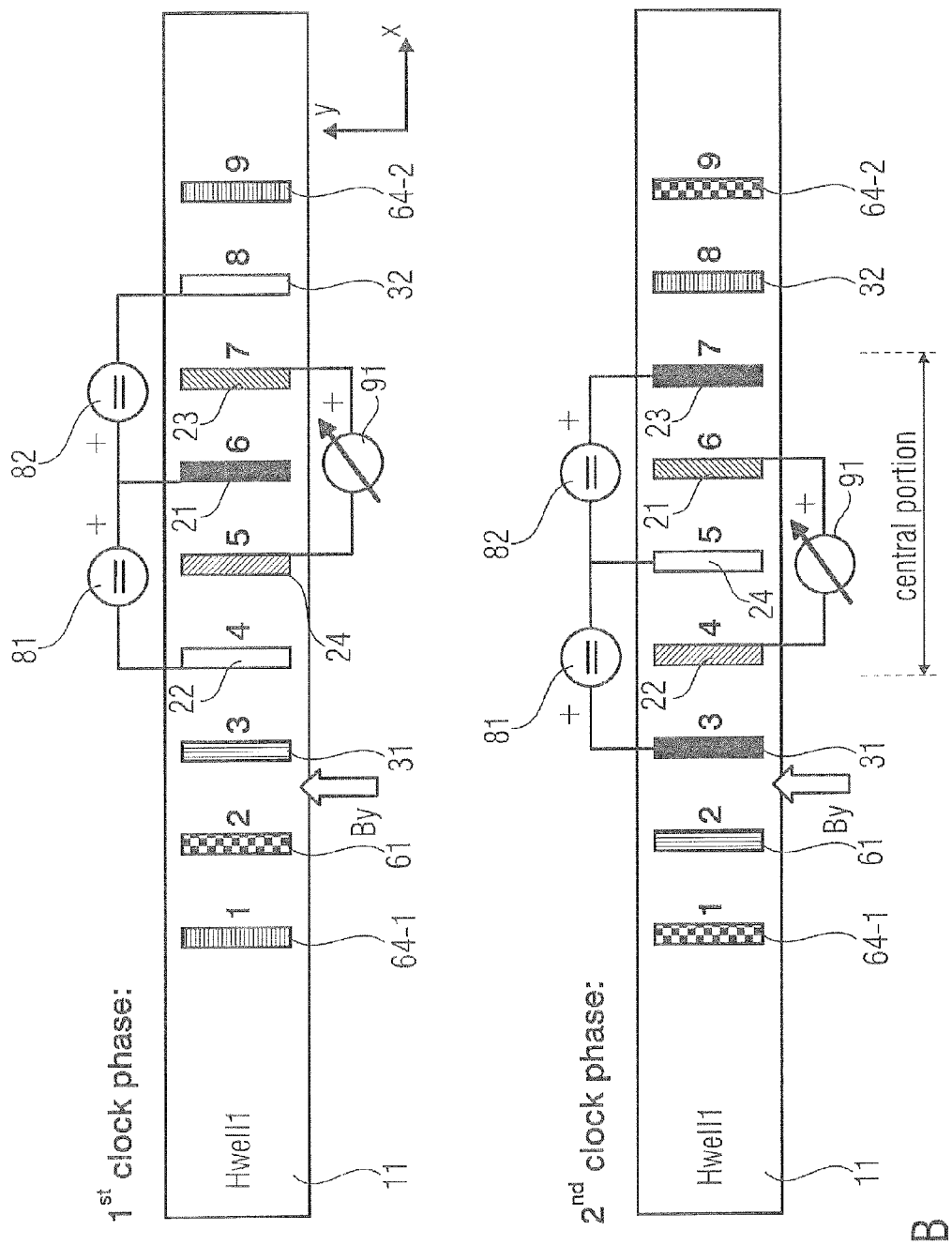

Equal or equivalent elements or elements with equal or equivalent functionality are denoted in the following description by equal or similar reference signs.

DETAILED DESCRIPTION

In the following description, a plurality of details are set forth to provide a more thorough explanation of embodiments of the teachings disclosed herein. However, it will be apparent to one skilled in the art that embodiments of the teachings disclosed herein may be practiced without these specific details. Features of the different embodiments described hereinafter may be combined with each other, unless specifically noted otherwise. For the most part, the terms "Hall effect region" and "tub" are used interchangeably herein. Accordingly, a Hall effect region may be a tub or a well of a first conductivity type which is embedded in a substrate or a tub of an opposite conductivity type. This structure may cause an electrical isolation of the tub against the substrate in particular if the resulting PN-junction is reversed biased.

When the vertical Hall sensor comprises two or more Hall effect regions, these may be isolated from each other. The electrical isolation of two Hall effect regions against each other may take several forms. According to a first form of isolation, the two or more Hall effect regions are disjoined from each other, i.e., two adjacent Hall effect regions do not merge at one or more locations but are separated by a material other than the Hall effect region material. As one possible option, the tub may be isolated in a lateral direction by means of trenches that are typically lined and/or filled with a (thin) oxide. As another option, the tub may be isolated towards the bottom by means of an SOI (silicon on insulator) structure. Although the tub typically has a single conductivity type, it may be advantageous to configure the doping concentration in an inhomogeneous manner, i.e., spatially variable. In this manner, a high concentration of the doping agent may occur in the area of the contact, as is usual with deep tub contacts, for example in CMOS technology. In the alternative, a layering of differently strongly doped layers may be sought after as is the case with, e.g., a buried layer. Such a layering may result, to some extent, from technological reasons relative to other electronic structures that are formed within the substrate. The design of the vertical Hall sensor may need to be reconciled with these circumstances, even though the layering may, in fact, be unfavorable for the vertical Hall sensor.

Another form of isolation may be achieved by measures that reduce or substantially prevent an electric current from flowing in one or more subregions of a tub or well. For example, the electric current may be offered an alternative current path that has lower ohmic resistance (possibly by several orders of magnitude) than a substantially parallel current path would have that goes through the tub. The current path having the lower ohmic resistance may be a conductor formed in or on the surface of the tub.

Preferably, the Hall effect region may be an n-doped semiconductor as this provides an approximately three times higher mobility and consequently a higher Hall factor than with a p-doped semiconductor. The doping concentration in the functional part of the Hall effect region is typically in the range of $10^{15}$ cm$^{-3}$ to $10^{17}$ cm$^3$.

Another possible material for the Hall effect regions is permalloy which is a nickel-iron magnetic alloy, or a material similar to permalloy. Permalloy exhibits a low coercivity, near zero magnetostriction, high magnetic permeability, and significant anisotropic magnetoresistance. A variation of the electrical resistance of permalloy within a range of approximately 5% can typically be observed depending on the strength and the direction of an applied magnetic field. This effect may be used in a similar manner as the Hall effect occurring in a semiconductor for sensing and/or measuring a magnetic field, and it is known in the literature as anomalous Hall effect.

The teachings disclosed herein are related to the use of the spinning current principle, in which supply terminals and sense terminals are exchanged in consecutive clock phases/operating phases. A sense terminal in a vertical Hall sensor responds to an electric current passing underneath it. A magnetic field (parallel to a die surface and perpendicular to the current streamline) can efficiently lift up or pull down the potential at the contact (which typically is at the surface of the die). Contacts at the end of a tub (or a Hall effect region) typically are not, or only negligibly, subject to current streamlines passing underneath them. Therefore, contacts at the ends of a tub typically are less frequently used as sense contacts.

When using the spinning current principle for vertical Hall devices, one challenge is the fact that typical vertical Hall devices are not symmetric, in terms of an interchangeability of supply contacts and sense contacts. However, the spinning current principle typically needs a highly symmetric device. A typical vertical Hall device may have a shape of a brick with several contacts. Some of the contacts are closer to one of the ends of the brick than other (more central) contacts. For this reason the outer contacts, when used as supply contacts, generate different potential distributions in the brick than the inner contacts. Therefore, if the spinning current principle periodically exchanges input with output terminals, the symmetry of the potential distributions will be poor.

According to one aspect of the teachings disclosed herein, the brick may be stretched and only the inner contacts may be used so that the outer contacts are far away and are not used for the output signal while the inner contacts are almost perfectly symmetric.

Besides sensing Hall effect-related sense signals primarily in a central portion of the Hall effect region, i.e., typically relatively far away from a first end and a second end of a Hall effect region with respect to a longitudinal direction, the following measures may also favor a more symmetric behavior of the vertical Hall sensor: using supply-only contacts and/or providing floating contacts between each two (adjacent) spinning current contacts. Typically, there is an even number of the supply-only contacts with one half of the supply-only contacts being arranged at one side of a central region in which the spinning current contacts are located, and the other half being arranged on the other side of the central region, in order to maintain the symmetry of the vertical Hall sensor. Vertical Hall sensors having four supply-only contacts appear to perform quite well with respect to improving the symmetry of the vertical Hall sensor and thus reducing the residual zero-point error. Nevertheless, embodiments having only two supply-only contacts may be conceived as well. Likewise, vertical Hall sensors having six or more supply-only contacts may also be designed. In the vicinity of each supply-only contact, the current density distribution may be subject to influences caused by either the first end or the second end of the Hall effect region, whichever is closer to the supply-only contact at hand. When approaching the central region and within the central region, however, the current density distribution becomes more and more homogeneous. In other words, local irregularities caused by the first end or the second end of the Hall effect region have only a relatively small influence on the current density distribution in the central region of the Hall effect region. Another possible reason for an inhomogeneous current density distribution within the Hall effect region may be found in the need for the electric current to change its direction of current flow twice while flowing through the Hall effect region. This phenomenon is believed to not only affect those supply contacts or supply-only contacts that are relatively close to the first end or the second end of the Hall effect region, but basically all supply contacts and supply-only contacts. The supply-only contacts, that are relatively far away from the central region of the Hall effect region, may level out, on average, the irregularities in the current density distribution within the central region up to a certain degree. In particular, the current density distribution in the central region during the first operating phase is typically much more similar to the current density distribution within the central portion during the second operating phase, except for the fact that the direction of current flow may be opposite in the second operating phase compared to the first operating phase, at least in some sections of the Hall effect region. This inversion of the current flow is, however, intentional and may be taken into account when determining the output signal of the vertical Hall sensor. In summary, the symmetry of the device can be increased by means of the supply-only contacts at the expense of a slightly increased current consumption.

According to the teachings disclosed herein, it is also possible to provide one or more floating contacts between each two adjacent spinning current contacts. These floating contacts are also called second type contacts in other parts of this disclosure. Floating contacts are low-ohmic compact regions at the surface (i.e., an accessible side) of the Hall effect region that are neither used for the purpose of supplying electrical energy nor for tapping a sense signal. Floating contacts may be used to influence the electric potential in the well similar to the gate of a CMOS transistor. As an alternative, the floating contacts could be highly doped wells that are not necessarily contacted to a metal region. Yet another alternative is that the floating contacts could be wells having a high doping concentration that are contacted to one or more metal spots by means of a contact plug. The floating contacts have the following effect: the current flow is pulled closer to a middle line of the Hall effect region extending between the first end and the second end in a substantially parallel or coinciding manner with the path along which the spinning current contacts (first type contacts) and the floating contacts (second type contacts) are arranged. Floating contacts that are smaller than the spinning current contacts and/or the supply-only contacts are particularly efficient in concentrating the current flow around the middle line of the Hall effect region. Note that the desired homogeneity of the current flow is mainly important in the longitudinal direction, i.e. parallel to the path along which the contacts are arranged. Pulling the current flow towards the middle line may be important when, due to process technological reasons it is not possible that the first type contacts extend over the entire width of the Hall effect region: in this case, the magnetic sensitivity is reduced due to portions of the electric current that flow in a direction parallel to the component of the magnetic field to be sensed (i.e., the y-direction according to the coordinate system used in most of the figures). In order to prevent/avoid these portions of the current, the floating contacts are arranged near the middle line which pull the current to the middle.

FIG. 1a shows, in the upper half, a schematic plan view of a vertical Hall sensor and a corresponding cross-section of the same vertical Hall sensor during a first operating phase or clock phase of a spinning current scheme or cycle. In the lower half, FIG. 1a shows the schematic plan view and a schematic cross-section of the same vertical Hall sensor during a second operating phase of the spinning current scheme. The vertical Hall sensor comprises a Hall effect region 11 that may be formed in a semiconductor substrate by locally doping the semiconductor substrate to obtain, e.g., an n-type semiconductor material (an n-type semiconductor has more electrons than holes). By locally doping the semiconductor substrate a well or a tub is formed within the semiconductor substrate. The well or tub may then be used as the Hall effect region 11. A plurality of contacts is formed in, or on a surface of, the Hall effect region 11. The plurality of contacts in one embodiment comprises four spinning current contacts 21, 22, 23, and 24. During the first operating phase of the vertical Hall sensor, the spinning current contacts 21 and 22 function as supply contacts. To this end, the spinning current contacts 21 and 22 are connected to a voltage supply 81. As an alternative to the voltage supply 81, a current source could be used as well. The two other spinning current contacts 23 and 24 are configured to function, during the first operating phase, as sense contacts so that they are connected to a voltage sensing element 91. During operation, the voltage supply 81 causes an electric current to flow to the spinning current contact 21 (supply voltage in operating phase 1), through a portion of the Hall effect region 11, thereby passing the spinning current contact 24 (sense contact), to the spinning current contact 22 (supply contact), and back to the voltage supply 81. A magnetic field By in the y-direction, i.e., parallel to the surface of the Hall effect region 11 and perpendicular to a longitudinal extension of the Hall effect region 11, has an influence on the electric charge carriers constituting the electric current within the portion of the Hall effect region extending between the supply contacts 22 and 21. A result of this influence is a variation of an electric potential at the sense contact 24, wherein the variation is a function of the magnetic field By in the y-direction. The variation of the electric potential at the sense contact 24 is referred to the sense contact 23 and a corresponding differential electric voltage can be sensed by the sensing element 91.

The contacts that are formed in or on the surface of the Hall effect region 11 may be referred to either by their reference numeral or by their ordinal number. Whenever possible, the reference numbers have been assigned (by definition) to the various contacts on the basis of a function of the particular contact during the first operating phase. For example, the spinning current contacts 21 to 24 have reference numerals in the 20s, whereas supply-only contacts have reference numbers in the 30s. In contrast, the ordinal numbers reflect a spatial arrangement of the contacts. The contacts may be thought of as arranged in a sequence along a path extending between a first end and a second end of the Hall effect region 11. In the figures the ordinal numbers are the numbers which are illustrated directly adjacent or within the corresponding contact. The ordinal numbers have an ascending order typically from left to right. To give an example: the spinning current contact 21 has the ordinal number 6. As a shorthand notation for the ordinal numbers the hash key symbol # will be used, e.g., "contact #6" for the just mentioned spinning current contact 21 which is at the sixth position from the left.

In the figures, an effort has been made to indicate a function of each contact during the operating phases of the spinning current scheme. Spinning current contacts currently functioning as supply contacts are solid white or solid black, depending on the pole of the voltage supply 81 they are connected to (positive pole: black; negative pole: white). Spinning current contacts currently functioning as sense contacts have a relatively dark, upward hatching (e.g., spinning current contact 23) or a relatively light, downward hatching (e.g., spinning current contact 24), depending on the pole of the sensing element 91 to which a particular sense contact is connected. Supply-only contacts, which will be explained in more detail below, are also solid white or solid black, depending on how they are connected to the voltage supply 81. Contacts that are floating during the first operating phase may have one of the following four patterns: small checkerboard pattern (e.g., contact with ordinal number 2), cross-hatching (e.g., contact with ordinal number 8), dense vertical hatching (e.g., contact with ordinal number 3), and horizontal hatching (e.g., contacts with ordinal numbers 1 and 9); these assignments being valid for FIG. 1*a* and not necessarily for other figures).

The vertical Hall sensor shown in FIG. 1*a* comprises a plurality of floating contacts 64-1, 61, 63, 62, and 64-2. The floating contacts 64-1, 61, and 63 are arranged on one side of the four spinning current contacts 21 to 24. The other two floating contacts 62 and 64-2 are arranged on another side of the four spinning current contacts 21 to 24. Due to the floating contacts 61, 62, 63, 64-1, and 64-2, the regular contact structure that is formed in or on the surface of the Hall effect region 11 does not abruptly end at the two outer spinning current contacts 22 and 23, but is continued (or extrapolated) for a few contacts. Thus, a distance between the two outer spinning current contacts 22, 23 to the first end or the second end of the Hall effect region 11 can be increased without introducing another source for inhomogeneity at the edges of a central portion of the Hall effect region 11 in which the four spinning current contacts 21 to 24 are arranged.

The lower half of FIG. 1*a* shows the vertical Hall sensor during a second operating phase of the spinning current scheme. The functions of the spinning current contacts 21 to 24 have been swapped so that the voltage supply 81 is now connected to spinning current contacts 23, 24, while the sensing element 91 is connected to the spinning current contacts 21, 22. Following the principle that a fill pattern of a contact typically illustrates its current function, the spinning current contact 23 is illustrated as solid black, the spinning current contact 24 is illustrated as solid white, the spinning current contact 21 is illustrated with a dark, upward hatching, and the spinning current contact 22 is illustrated with a bright, dark numbered hatching. Although they are not connected to any other circuitry in FIG. 1*a*, the fill patterns of the floating contacts 61, 62, 63, 64-1 and 64-2 are also changed in the lower half of FIG. 1*a* with respect to the upper half thereof.

The operation of the vertical Hall sensor shown in FIG. 1*a* may be described as follows: in a first clock phase (operating phase) a voltage source 81 is connected to two inputs having the ordinal numbers 4 and 6. A sense element or voltmeter 91 is connected to the two outputs with the ordinal numbers 5 and 7. In the second operating phase, the inputs and the outputs are exchanged: the voltage source 81 is connected to the two inputs with the ordinal numbers 5 and 7 and the voltmeter 91 (or another voltmeter) is connected to the two outputs with ordinal numbers 4 and 6. In an optional third operating phase, the voltage source 81 and the voltmeter 91 are connected to the same contacts as in the first operating phase, but with reversed polarity. In an optional fourth operating phase the voltage source 81 and the voltmeter 91 (or the other voltmeter) are connected to the same contacts as in the second operating phase, but with reversed polarity. All other contacts (i.e., contacts with the ordinal numbers 1, 2, 8, and 9) are left floating. Instead of measuring the differential output voltage between the contacts with ordinal numbers 5 and 7 in the first operating phase, one may measure only the electric potential at the contact having ordinal number 5 (referred to ground potential). Analogously, instead of measuring the differential output voltage between the contacts with ordinal numbers 4 and 6 in the second operating phase, one may measure only the electric potential at the contact with ordinal number 6.

Note that the Hall effect region 11 extends beyond the outmost contacts 64-1 and 64-2. This is done in order to reduce the asymmetry of the outer contacts 64-1, 64-2, when compared with the inner contacts. Note also that several outer contacts are not in use, meaning that they are not supplied with electricity and there is no (volt) meter connected to them: they are simply floating. They are used only for the purpose of minimizing the asymmetry of the outer contacts. Effectively, only the four spinning current contacts 21 to 24 are in use and the role of inputs and outputs is exchanged in the two operating phases. The contacts are typically identical in size and are arranged on a regular grid and positioned in a symmetric manner with respect to the Hall effect region 11 in order to maximize their symmetry. The two outmost contacts 64-1 and 64-2 could be short-circuited (i.e., connected by a conductor) in one embodiment, in order to increase the symmetry (short-circuit not shown in FIG. 1*a*).

FIG. 1*b* shows two schematic plan views of a vertical Hall sensor according to an embodiment of the teachings disclosed herein in a first operating phase (top) and a second operating phase (bottom). In comparison to the vertical Hall sensor shown in FIG. 1*a*, the vertical Hall sensor shown in FIG. 1*b* is more symmetric. In the configuration of a vertical Hall sensor shown in FIG. 1*b*, some of the outer contacts are used to apply the electric energy to the device, in order to increase the symmetry of the potential distribution. The improved vertical Hall stripe shown in FIG. 1*b* comprises nine identical contacts in a Hall effect region 11 arranged on a regular grid along the x-axis in order to measure magnetic fields in the y-direction By. The vertical Hall sensor is the same as in FIG. 1*a*, but the supply voltage is connected to one more contact: in the first operating phase a contact 32 (ordinal number 8) is additionally grounded and in the second operating phase a contact 31 (ordinal number 3) is additionally tied to positive supply voltage as this gives a better symmetry between contacts 24 and 23 (#5 and #7, respectively) in operating phase 1 and between contacts 22 and 21 (#4 and #6, respectively). Therefore, at zero magnetic field By the output voltages in operating phase 1 and operating phase 2 are much closer to zero than in FIG. 1*a*.

The contacts 31 and 32 are supply-only contacts, because they are only used as supply contacts throughout the spinning current scheme, but not as sense contacts (extension of the spinning current scheme or generalization thereof). The two supply-only contacts 31, 32 are arranged on both sides of a central portion of the plurality of contacts. The four spinning current contacts 22, 24, 21, and 23 are located in the central portion. The two supply-only contacts 31 and 32 are arranged on both sides of the central portion in a distributed manner, i.e., there are substantially as many supply-only contacts on a first side of the central portion as on the second side thereof. The length of the Hall effect region 11 may be greater than a corresponding length of the central portion by a factor comprised in a range between 1.2 and 20, or a narrower range such as between 1.5 and 15, between 2 and 10, or between 3 and 8. Supply-only contacts serve to supply electric energy in at least one of the operating phases of the spinning current scheme, but they do not serve to sense a sense signal during other operating phase(s). For example, they may be floating during the other operating phase(s).

The vertical Hall sensor comprises a second voltage supply 82 that is connected to the spinning current contacts 21 and 22 during the first operating phase and to the spinning current contacts 23 and 24 during the second operating phase of the spinning current scheme.

Note that the contacts are symmetrical to the Hall effect region 11 in operating phase 2, but not in operating phase 1: one might take account of this by making the Hall effect region 11 slightly shorter at the left side.

It is also possible to supply additionally the contact 61 (#2) with positive supply voltage in operating phase 1 and the contacts 64-1, 64-2 (#1 and #9, respectively) with the electric ground potential in operating phase 2, in order to make the potential distribution even more symmetric in both operating phases. This becomes apparent when looking at the vertical Hall sensor from the perspective of the output contacts 23 and 24 (#5 and #7, respectively) in operating phase 1 and from the perspective of the contacts 21 and 22 (#4 and #6, respectively) in operating phase 2.

According to the embodiments shown in FIG. 1*b*, the outmost contacts 64-1 and 64-2 are not used as inputs for electrical energy. Instead, the outmost contacts 64-1, 64-2 are floating contacts. Another floating contact is contact 61 (#2). In particular, a first floating contact 64-1 of the at least two floating contacts 61, 64-1, 64-2 may be formed in or on the surface of the Hall effect region 11 between the first end and one supply-only contact 31 of the at least two supply-only contacts 31, 32 that is closer to the first end than the other(s) of the at least two supply-only contacts. A second floating contact 64-2 of the at least two floating contacts is formed in or on the surface of the Hall effect region 11 between the second end and one supply-only contact 32 of the at least two supply-only contacts that is closer to the second end than the other(s) of the at least two supply-only contact.

In cases where the outmost contacts and/or contacts that are not the outmost contacts, but nevertheless relatively far out, are used as supply contacts, it may be possible to use a different input voltage or current for these supply contacts in an effort to increase the symmetry of the potential distribution at zero magnetic field.

The sense contacts in both operating phases, i.e., contacts 23 and 24 in the first operating phase and contacts 21 and 22 in the second operating phase, are "framed" by supply contacts having different polarities. For example, the sense contact 24 during the first operating phase is adjacent to the supply contact 22 having negative polarity and, at the other side, adjacent to the supply contact 21 having positive polarity. Moreover, the directions of the electric currents passing by the sense contacts 23, 24 during the first operating phase are opposite to each other. The magnetic field in the y-direction acts on the electric current flowing in opposite directions in the different portions of the Hall effect region in an opposite manner: pushing the current streamlines towards the surface of the Hall effect region 11 near the sense contact 24 and pulling away the current streamlines from the surface of the Hall effect region 11 near the sense contact 23, or vice versa. This leads to a relatively pronounced difference in the electric potentials measured at the sense contacts 23, 24 and thus to a relatively high differential voltage that can be sensed or measured by the sense element 91. The situation is similar during the second operating phase with respect to the contacts 21 and 22 functioning as sense contacts during the second operating phase.

Figure 1C:
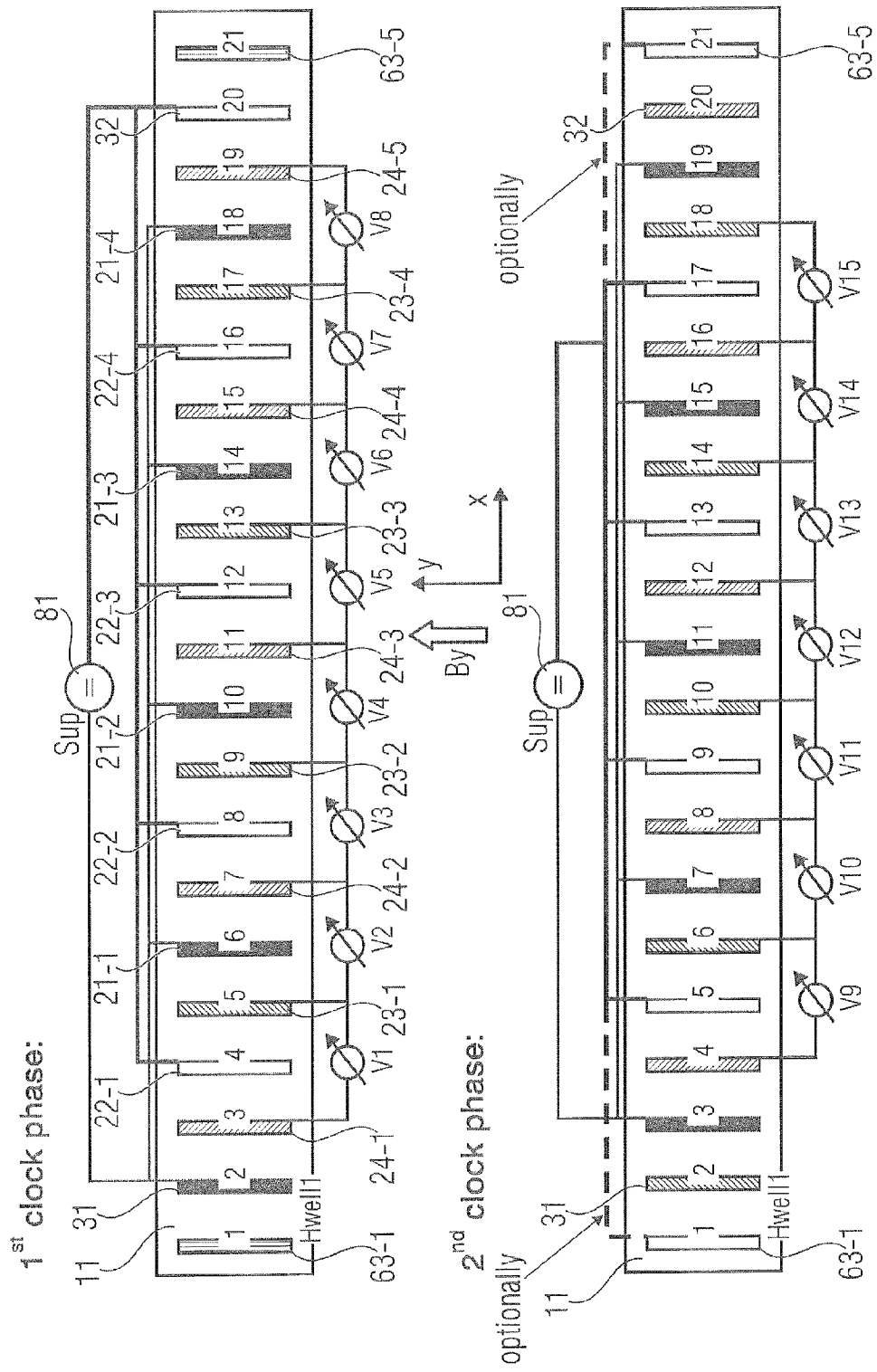
FIG. 1c shows schematic plan views of a vertical Hall effect sensor according to an embodiment of the teachings disclosed herein in a first and a second operating phase, respectively.

FIG. 1*c* shows a plan view of a vertical Hall sensor according to another embodiment of the disclosed teachings. In this embodiment, more "inner" contacts are used, so that the percentage of outer contacts is reduced. The vertical Hall sensor shown in FIG. 1*c* comprises the Hall effect region 11, in or on the surface of which 21 identical contacts numbered from 1 to 21 from left to right are arranged on a regular grid along the x-axis in order to measure the magnetic field in the y-direction By. The upper half of FIG. 1*c* shows the vertical Hall sensor in its configuration for the first operating phase of the spinning current scheme and the bottom half of FIG. 1*c* shows the same vertical Hall effect sensor in its configuration for the second operating phase.

During the first operating phase the contacts 31, 21-1, 21-2, 21-3, and 21-4 function as positive supply contacts (indicated by the solid black filling) and are connected to a positive terminal of the voltage supply 81. The contacts 22-1, 22-2, 22-3, 22-4, and 32 are configured to function as negative supply contacts during the first operating phase (indicated by the solid white filling) and are connected to a negative terminal of the voltage supply 81. A first group of sense contacts comprises the contacts 23-1 to 23-4 (dark, upward hatching). Each of the sense contacts 23-1 to 23-4 is framed by a negative supply contact 22-$i$ on the left and a positive supply contact 21-$i$ on the right. The sense contacts 23-1 to 23-4 are connected to two sense elements of a plurality of sense elements V1 to V8. For example, the sense contact 23-1 is connected to a second input of a sense element V1 and a first input of a sense element V2. A second group of sense contacts comprises the contact 24-1 to 24-5 (light, downward hatching), each of which is connected to one or two of the eight sense elements V1 to V8. Each one of the sense contacts 24-1 to 24-5 is framed by a positive supply contact 31 or 24-($i$−1) on the left and a negative supply contact 22-$i$ or 32 at the right.

The vertical Hall sensor also comprises two floating contacts 63-1 and 63-5 as the outmost contacts, i.e., having the ordinal numbers 1 and 21, respectively.

The contacts having ordinal numbers from #3 to #19 are spinning current contacts which means that each one of the spinning current contacts functions as a supply contact during the first operating phase and a sense contact during a second operating phase, or vice versa. Furthermore, the spinning current contacts are arranged along a central portion of the Hall effect region. More precisely, the entire plurality of contacts numbered 1 through 21 is arranged in a sequence along a path extending between a first end (e.g., the left end) and a second end (e.g., the right end) of the Hall effect region 11. In the configurations shown in FIGS. 1$b$ and 1$c$ the path is not explicitly depicted in the figures, but it can be derived from the arrangement of the contacts that the path is straight or rectilinear in both cases. In general, the path may have other forms as well, such as curved, angled, polygonal, or piece-wise straight. In the vertical Hall sensor shown as a schematic plan view in FIG. 1$c$ the central portion extends from between the contacts having ordinal numbers #2 and #3 to somewhere between the contacts with the ordinal numbers #19 and #20.

During the second operating phase the spinning current contacts have changed their respective functions so that former supply contacts 21-$i$, 22-$i$ now function as sense contact and former sense contacts 23-$i$, 24-$i$ function as supply contacts.

The contacts 31 and 32 are supply-only contacts that function as supply contacts during the first operating phase, but are left floating during the second operating phase. The spinning current scheme is applied or extended to the supply-only contacts 31, 32 during the first operating phase, but it is not applied to these contacts during the second operating phase. If the spinning current scheme would be applied to the supply-only contacts 31, 32 during the second operating phase, the supply-only contact 31 would have to act as a sense contact of the first group and the supply-only contact 32 would have to function as a sense contact of the second group mentioned above. As the supply-only contacts 31, 32 are relatively close to the first and second ends of the Hall effect region 11, respectively, the current distribution may be notably asymmetric in the vicinity of the supply-only contacts 31, 32, which is likely to degrade a performance of the vertical Hall sensor with respect to reducing the zero-point error as much as possible.

During the second operating phase, seven sense elements V9 to V15 are used in order to sense seven differential voltages between pairs of sense contacts. On the basis of the differential voltages sensed or measured by the sense elements V1 to V8 during the first operating phase and of the sense elements V9 to V15 during the second operating phase, an output signal of the vertical Hall sensor may be determined, for example, by means of a linear combination of the various differential voltages.

As an option, the floating contacts 63-1 and 63-5 may be used as supply-only contacts during the second operating phase, as indicated in the bottom half of FIG. 1$c$ by the dashed lines, in order to further improve the symmetry of the current distribution during the second operating phase. In this case, the vertical Hall sensor would comprise four supply-only contacts, 63-1, 31, 32, and 63-5 (having the ordinal numbers #1, #2, #20, and #21, respectively). The four supply-only contacts comprise two outermost supply-only contacts which may be spaced apart from the first and the second end by a distance greater than a maximal spacing of the at least four spinning current contacts.

The operation of the vertical Hall sensor shown in FIG. 1$c$ may be summarized as follows (the contacts will be referred to by means of their ordinal numbers). In the first operating phase, the electric current flows from contact #2 to #4, #6 to #4, #6 to #8, #10 to #8, #10 to #12, #14 to #12, #14 to #16, #18 to #16, #18 to #20. The voltages are tapped at the contacts in between the supply contacts whereby the potential at contacts #5, #9, #13, #17 goes up (under the action of a particular By field) wherein the potential at the contacts #3, #7, #11, #15, and #19 goes down. The eight sense elements or voltmeters V1 . . . V8 may be used to measure these signals differentially.

In the second operating phase the current flows from contacts #3 to #5, #7 to #5, #7 to #9, #11 to #9, #11 to #13, #15 to #13, #15 to #17, #19 to #17. The voltages are again tapped at the contacts in between these supply contacts. Whenever the potentials in the first operating phase at contacts #5, #9, #13, #17 increase due to a By field, the potentials in the second operating phase at contacts #6, #10, #14, #18 also increase while the potentials in operating phase 2 at contacts #4, #8, #12, #16 decrease. One may measure these potentials with the seven sense elements or voltmeters V9 . . . V15.

Note that we can regard the device reaching from contact #3 to contact #5 in the second operating phase as a basic building block, whose mirror counterpart is placed to its right, then again mirrored at the right edge and placed to the right, then again mirrored at the right edge, etc. Therefore, the current consumption of a long strip as the Hall effect region increases, because several current paths are connected in parallel. As a countermeasure, the width (i.e., the extension of the contacts and the Hall effect region 11 in y-direction) may be kept small. Anyhow, several devices are typically connected in parallel in order to reduce the resistance and the noise of the output signal. Three options may be considered: (i) use several devices in several Hall effect regions and connect them in parallel by wires, (ii) use a wider Hall effect region 11 and wider contact strips to reduce the internal resistance, and (iii) use a longer strip with more contacts with a narrow Hall effect region and narrow contacts. From these three options number (iii) is typically desired in one embodiment, because the influence of the asymmetries at the right and left edges are more strongly reduced than with the other solutions. Usually, the spacing of the contact scales with the depth (i.e., the extension into the drawing plane in FIG. 1$c$) of the Hall effect region. The depth is in the order of 5 μm in modern CMOS processes, such as 2 μm, 3 μm, 4 μm, 5 μm, 6 μm, 7 μm, 8 μm, or 9 μm. Therefore, the spacing of the contacts is similar (+/−1 μm or +/−2 μm). Thus, a device with 21 contacts may be about 130 μm long in one embodiment (or more generally between 50 μm and 250 μm, depending on the contact spacing) which is acceptable for most applications.

In FIG. 1c, separate voltmeters V1 to V15 are depicted that are used to measure the output voltages of neighboring cells or basic building blocks. Two neighboring voltages can be subtracted and all these terms can be summed up to get the total signal per operating phase. In general, a linear combination of the readings of the voltmeters V1 to V8 and of the voltmeters V9 to V15 may be used. As another option it is also possible to compute the average of the outputs of the voltmeters V1 to V8 and also the average of the outputs of the voltmeters V9 to V15. This may be done by hardware when contacts #3, #7, #11, #15, #19 are tied together and contacts #5, #9, #13, #17 are tied together in the first operating phase. The potential may then be measured between these two nodes. Doing so may, however, result in reduced performance (meaning: larger residual zero-point error), because due to mismatch there will typically be current flowing between the output port and this leads to larger zero-point errors. One elegant way to compute the average of all output voltages in an isolated way is to split up the large MOSFETs of the differential input pair of a pre-amplifier (i.e., the first amplifier connected to the outputs of the Hall devices) and to connect the voltmeter V1 to the first part of it, the voltmeter V2 to the second, the voltmeter V3 to the third, etc. This method reduces the noise, but does not increase the signal.

Figure 1D:
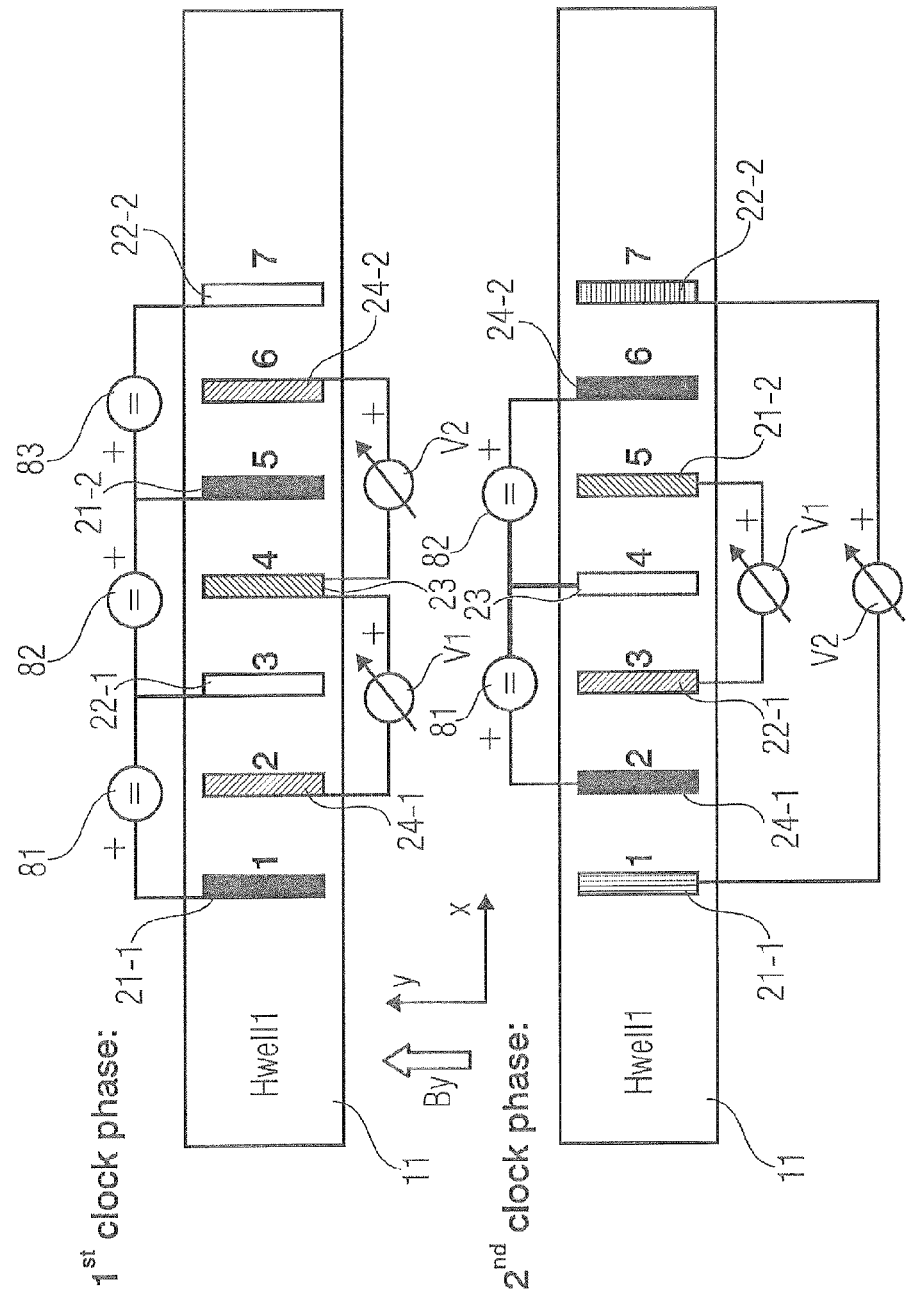
FIG. 1d shows schematic plan views of a vertical Hall sensor during a first and a second operating phase, respectively, to illustrate how differential sensor signals may be tapped at the sensor contacts in a nested manner.

FIG. 1d shows a schematic top view of a vertical Hall sensor with seven identical contacts numbered 1 to 7 in the Hall effect region 11 arranged on a regular grid along the x-axis in order to measure By fields. During the first operating phase the contacts 21-1 and 21-2 (#1 and #5, respectively) are configured to function as positive supply contacts. The contacts 22-1 and 22-2 (#2 and #7, respectively) are configured to function as negative supply contacts during the first operating phase. The sense contact 23, (#4) is substantially located in the middle of the Hall effect region 11 and is connected to a positive input of a first sense element V1 and a negative input of a second sense element V2. Two other sense contacts 24-1 and 24-2 are also connected to the first and second sense elements V1, V2. The supply contacts 21-1, 21-2, 22-1, and 22-2 are connected to one or two voltage supplies of the voltage supplies 81, 82, 83.

In the second operating phase only two voltage supplies 81, 82 are used to supply electric energy to the vertical Hall sensor. All seven contacts of the vertical Hall sensor are spinning current contacts so that the former supply contacts 21-1, 22-1, 21-2, and 22-2 function as sense contacts during the second operating phase. The contacts 23, 24-1 and 24-2 function as supply contacts and are thus connected to the voltage supplies 81, 82 in the manner depicted in FIG. 1d. A first differential voltage may be tapped between the contacts 22-1 and 21-2 by means of the sense element or voltmeter V1. A second differential voltage may be tapped as a second sense signal between the sense contacts 21-1 and 22-2 by means of the sense element or voltmeter V2. Note that the two sense elements V1 and V2 tap their respective differential voltages in a nested manner with respect to the sequence of the seven contacts.

The vertical Hall sensor shown in FIG. 1d has an odd number of contacts (7 or 11 or 15; FIG. 1d illustrates a configuration having seven contacts). The symmetry may be increased by using the outmost contacts 21-1 and 22-2 as supply (=input) contacts in the first operating phase and as sense (=output) contacts in the second operating phase. Moreover, they may have different polarity in both phases, as illustrated in FIG. 1d: in the first operating phase one of the outmost contacts is at positive potential (contact 21-1 having ordinal number 1 in FIG. 1d) while the other one is at negative potential (contact 22-2 having ordinal number 7 in FIG. 1d). In the second operating phase one of the outputs increases with an applied magnetic field By, whereas the other one decreases (compare the contacts 21-1 (#1) and 22-2 (#7) in the second operating phase in FIG. 1d). Note that in the second operating phase the electric potential (without applied magnetic field) at contact 21-1 is different from the electric potential at contact 22-1, yet the (common mode) potentials at the contact 21-1 and 22-2 are identical and the (common mode) potentials at 22-1 and 21-2 are also identical due to symmetry. Therefore, the output signals may be measured between the contacts 21-1 and 22-2, as well as between the contacts 22-1 and 21-2 and subtract them in order to get a signal of the vertical Hall sensor during a second operating phase. In the first operating phase the two measured voltages between the contacts 24-1 and 23, as well as between the contacts 23 and 24-2 are also subtracted to get a signal of the vertical Hall sensor for the first operating phase. Averaging or low-pass filtering the output signal of the vertical Hall sensor for the first operating phase and the second operating phase yields a relatively accurate measurement of the magnetic field in the y-direction with low zero-point error or offset.

The vertical Hall sensor shown in FIG. 1d uses three voltage supplies 81, 82, 83 in the first operating phase and only two voltage supplies 81, 82 in the second operating phase. Two sense elements or voltmeters V1 and V2 are used in both the first and the second operating phase.

Figure 2:
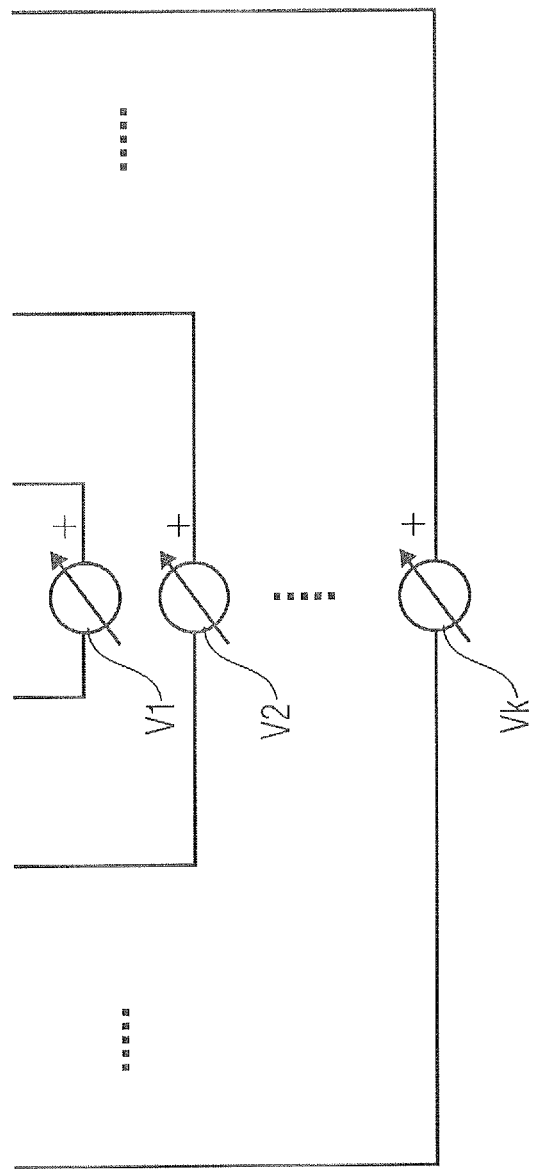
FIG. 2 illustrates an extension of tapping differential sensor signals at the sense contact in a nested manner.

The principle illustrated in FIG. 1d can be generalized to more than seven contacts: whenever the potential distribution is symmetric to the center in at least one of the operating phases, the differential voltages may be measured in a nested way as illustrated in FIG. 2. FIG. 2 shows three voltmeters V1, V2, and Vk of a plurality of k voltmeters, which tap differential voltages along the Hall effect region in a nested manner. The innermost voltmeter V1 is connected to the two innermost sense contacts while the outermost voltmeter Vk is connected to the two outmost sense contacts. In the configuration of FIG. 1d, bottom half, the electric current flows from left to right between the two supply contacts 24-1 and 23, whereas the electric current flows from right to left between the two supply contacts 24-2 and 23. This observation can also be made for a vertical Hall sensor implementing the voltmeter configuration shown in FIG. 2: the direction of electric current flow is opposite in the vicinity of the two sense contacts that are connected to one of the k voltmeters V1 to Vk. In summary, the at least four spinning current contacts may comprise an odd number of spinning current contacts equal to or greater than seven. During at least one operating phase of the spinning current scheme an even number equal to or greater than four of the spinning current contacts may be configured to function as sense contacts. Differential sense signals may be tapped between pairs of the spinning current contacts functioning as sense contacts during said operating phase, wherein the pairs are arranged along the path in a nested manner.

FIG. 3 shows the schematic plan view or top view of a vertical Hall sensor with two Hall effect regions 11 and 11'. The entire vertical Hall sensor comprises 18 substantially identical contacts of which contacts with the ordinal numbers 1 to 9 are arranged in the first Hall effect region 11 and contacts with the ordinal numbers 1' to 9' are arranged in the second Hall effect region 11'. Within each of the Hall effect regions 11, 11' the contacts are arranged on a regular grid along the x-axis in order to a measure magnetic field By in the y-direction. Hence, the vertical Hall sensor may comprise two separate wells formed in a substrate, each having nine contacts. The inputs of the first Hall effect region are contacts 21 and 22 (#6 and #4, respectively) during the first operating phase. The corresponding contacts at the second Hall effect region 11', i.e. contacts 23' and 24' (#6' and #4', respectively) are used as outputs of the second Hall effect region 11'. The outputs of the first Hall effect region 11 are the contacts 23 and 24 (#7 and #5, respectively), while the corresponding contacts 23' and 24' (#6' and #4', respectively) of the second Hall effect region 11' are used as inputs. Both output signals (between contacts #5 and #7, as well as between contacts #4' and #6') are added to give a total output signal in the first operating phase. In the second operating phase the output signals between the contacts #4 and #6, as well as between #5' and #7' are added to give the total output signal. The sum of both total output signals is proportional to the magnetic field in the y-direction By with a greatly reduced zero point error. Both Hall effect regions 11, 11' could be connected at their leftmost and/or rightmost ends or edges.

The first Hall effect region 11 comprises five floating contacts. Three contacts 64-1, 61, and 63 are arranged to the left of the region where the spinning current contacts 21 to 24 are arranged (central portion). Two other floating contacts 62 and 64-2 are arranged on the right side of the spinning current contacts 21 to 24. The second Hall effect region 11' has three floating contacts 62-1', 63', and 61' at the left side of the spinning current contacts 21' to 24' and two floating contacts 64', 62-2' on the right of the spinning current contacts 21' to 24'.

FIG. 4 shows a schematic top view or plan view of another vertical Hall sensor with 18 substantially identical contacts. Nine of the substantially identical contacts numbered from 1 to 9 are arranged on a first Hall effect region 11 and the remaining nine of the substantially identical contacts numbered 1' to 9' are arranged on the second Hall effect region 11'. The nine contacts arranged on the same Hall effect region 11 or 11' are arranged on a regular grid along the x-axis in order to measure magnetic fields in the y-direction By. The vertical Hall sensor shown in FIG. 4 uses cross-coupled outputs as follows: in the first operating phase a first output voltage is measured between a sense contact 23 of the first Hall effect region 11 and a sense contact 24' of the second Hall effect region 11' by means of a sense element or voltmeter V11, so that a voltage at the sense element V11 is equal to V11=V5-V4', where V5 is the electric potential at the sense contact 23 (#5 in the sequence of the first Hall effect region 11) and V4' is the electric potential at the sense contact 24' (#4' in the sequence of the second Hall effect region 11'). A second output voltage is measured between the sense contacts 24 (#7 in Hall effect region 11) and the sense contact 23' (#6' for Hall effect region 11') by means of the sense element or voltmeter V12 so that V12=V7-V6', wherein V7 designates the electric potential at contact #7 of the first Hall effect region 11 and V6' designates the electric potential at the contact #6' of the second Hall effect region 11'. The total output voltage for the first operating phase is computed as the difference of both: Sig1=V11-V12. Similarly, in the second operating phase the first output voltage is measured between contact 22 (#4) and contact 22' (#5') by means of a sense element or voltmeter V21 with a differential voltage V21=V4-V5', wherein V4 is the electric potential measured at the sense contact 22 of the first Hall effect region 11 and V5' is the electric potential at the sense contact 22' of the second Hall effect region 11'. A second output voltage is measured between the sense contacts 21 and 21' by means of a sense element or voltmeter V22 as a differential voltage V22=V6-V7', wherein V6 is the electric potential at the sense contact 21 (#6 in Hall effect region 11) and V7' is the electric potential at the sense contact 21' (#7' in the second Hall effect region 11'). A total output voltage is computed as the difference of both: Sig2=V21-V22. The difference of both total output voltages is Sig1-Sig2=V11-V12-V21+V22 and is proportional to the magnetic field in the y-direction By with greatly reduced zero-point error.

Three floating contacts 63-1, 61, and 64 are arranged to the left of the spinning current contacts 21 to 24 in or on the surface of the first Hall effect region 11. Two further floating contacts 62 and 63-2 are arranged to the right of the spinning current contacts 21 to 24. Regarding the second Hall effect region, three floating contacts 62-1', 63', and 61' are arranged to the left of the spinning current contacts 21' to 24' and two floating contacts 64', 62-3' are arranged to the right thereof.

Figure 5B:
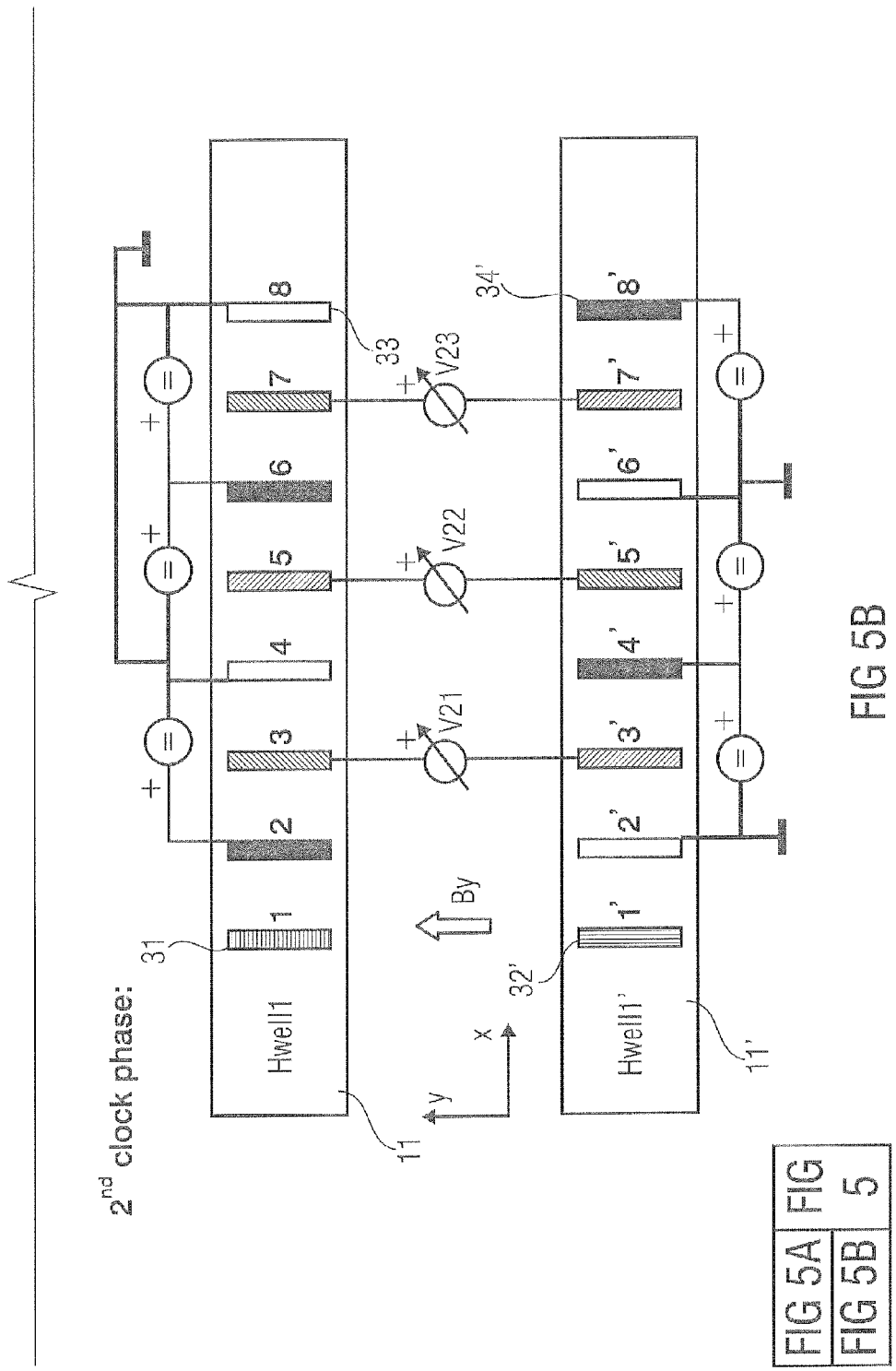
FIG. 5 shows schematic plan views of a vertical Hall sensor having two Hall effect regions according to an embodiment of the disclosed teachings in a first and a second operating phase, respectively.

FIG. 5 shows a schematic top view or plan view of a vertical Hall sensor according to an embodiment of the teachings disclosed herein. The vertical Hall sensor comprises 16 substantially identical contacts, eight of which are arranged in or on the surface of the first Hall effect region 11 and the remaining eight contacts are arranged in or on the surface of the second Hall effect region 11'. In or on the surface of the first and second Hall effect regions 11, 11' the corresponding contacts are arranged on a regular grid along the x-axis in order to measure magnetic fields in the y-direction By. The configuration of the vertical Hall sensor shown in FIG. 5 uses cross-coupled outputs of the first and second Hall effect regions 11, 11'.

For the first Hall effect region 11 the spinning current contacts are the contacts having ordinal numbers between 2 and 7 and for the second Hall effect region 11' the spinning current contacts are the contacts having ordinal numbers between 2' and 7'. The outmost contacts in or on each Hall effect region 11, 11' are supply-only contacts. In particular, the first Hall effect region 11 has a supply-only contact 31 which is connected to a positive pole of the voltage supply during the first operating phase of the spinning current scheme. A second supply-only contact 33 formed in or on the first Hall effect region 11 is left floating during the first operating phase. With respect to the second Hall effect region 11' a supply-only contact 32' is connected to a negative pole of the voltage supply during the first operating phase. The other supply-only contact 34' is left floating during the first operating phase.

During the second operating phase the supply-only contact 31 of the first Hall effect region 11 is left floating, while the other supply-only contact 33 of the first Hall effect region 11 is now connected to the negative pole of a voltage supply and thus functions as a supply contact. The left supply-only contact 32' of the second Hall effect region 11' is also left floating during the second operating phase, whereas the right supply-only contact 34' of the second Hall effect region 11' is connected to a positive pole of a voltage supply, i.e., the supply-only contact 34' functions as a supply contact during the second operating phase.

Regarding the symmetry of the vertical Hall sensor, the contacts having ordinal numerals 8 and 8' are floating while the leftmost contacts with ordinal numbers 1 and 1' are at reference and supply potential, respectively, during the first operating phase. During the second operating phase the contacts with ordinal numbers 1 and 1' are floating while the rightmost contacts are at reference and supply potentials, respectively. In one embodiment, the spacing in y-direction between the first and the second Hall effect regions, 11, 11' is small (e.g., <10 μm). The spacing depends on the application: if the application has homogeneous fields, the spacing can also be larger and, for example, a conventional Hall plate for measuring magnetic field components perpendicular to the surface of the Hall effect regions 11, 11' could be inserted in between the first and second Hall effect regions 11, 11'.

Three differential voltages are tapped in a Hall effect region-spanning manner during the first operating phase. A first differential voltage V11 is tapped between the contacts 23-1 and 24-1' by means of a corresponding sense element or voltmeter. A second differential signal V12 is tapped between the contacts 24 and 23'. A third differential voltage V13 is tapped between the sense contacts 23-2 and 24-2'. During the second operating phase three further differential voltages V21, V22, and V23 are tapped in a Hall effect region-spanning manner. The six differential voltages measured during the first and the second operating phase may be processed in a similar manner to what has been explained in connection with FIG. 4. In particular a linear combination of the differential voltages V11 to V23 may be determined.

When examining the contact configurations of the first and second Hall effect regions 11, 11' it can be seen that the functions of the various electrodes numbered 1' to 8' of the second Hall effect region 11' are substantially complementary to the functions of the corresponding contacts numbered 1 to 8 of the first Hall effect region 11. For example, the contact having the ordinal number 1 in the sequence of the first Hall effect region 11 functions as a positive supply contact during the first operating phase, while its counterpart having the ordinal number 1' in the second Hall effect region 11' functions as a negative supply contact during the first operating phase. Similar observations can be made for the remaining contacts 2 to 8 and their corresponding contacts 2' to 8'. The contacts of the first Hall effect region 11 and the contacts of the second Hall effect region 11' are also complementary to each other during the second operating phase.

In order to summarize the embodiment of the vertical Hall sensor shown in FIG. 5: The vertical Hall sensor may further comprise a further Hall effect region 11' in, or on a surface of which, is formed a further plurality of contacts similar to the plurality of contacts formed in or on the surface of the Hall effect region 11. The further plurality of contacts is configured to function in a complementary manner to the plurality of contacts. During each operating phase of the spinning current scheme at least one first sensor signal is tapped between at least two of the spinning current contacts of the plurality of contacts formed in or on the surface of the Hall effect region and at least one second sense signal is tapped between at least two spinning current contacts of the further plurality of contacts formed in or on the surface of the further Hall effect region, and wherein the at least one first sense signal and the at least one second sense signal are added or subtracted from each other by an output signal determiner of the vertical Hall sensor. The further Hall effect region 11' is substantially parallel to the Hall effect region 11. The spinning current contacts of the Hall effect region 11 and the further Hall effect region 11' between which the sense signal is tapped have a corresponding position within the plurality of contacts and the further plurality of contacts, respectively. A plurality of the spinning current contacts functioning as supply contacts and of the supply-only contact is inversed between the Hall effect region 11 and the further Hall effect region 11' for a particular operating phase of the spinning current scheme (i.e., contacts at corresponding positions in the Hall effect region 11 and the further Hall effect region 11' have opposite electric polarities), so that directions of electrical current flow are opposite to each other in corresponding portions of the Hall effect region and the further Hall effect region.

FIG. 6 shows schematic plan views of a vertical Hall sensor during a first operating phase and a second operating phase. The vertical Hall sensor comprises a single Hall effect region 11 and a plurality of 20 substantially identical contacts. The 20 substantially identical contacts are arranged along a straight line or path (coinciding with the x-axis) in an evenly spaced manner. The contacts are numbered in a rising order of their x-coordinates in a same manner as elsewhere within the description of the other figures herein. The 20 substantially identical contacts are spinning current contacts and they are configured to alternatingly function as supply contacts and sense contacts according to a spinning current scheme. Every fourth contact is shorted: thus, contact 21-1 (#1) is shorted to contact 21-2 (#5), 21-3 (#9), 21-4 (#13), and 21-5 (#17), resulting in a single node N1 (dotted line in FIG. 6). In a similar manner the contacts 22-1 to 22-5 having ordinal numerals #3, #7, #11, #15, and #19 are shorted (dashed line) resulting in a single node N3. Shorting the contacts 23-1 to 23-5 (widely dash-dotted line) results in a single node N4. Finally, the contacts 24-1 to 24-5 (ordinal numerals #2, #6, #10, #14, and #18) are shorted (narrowly dash-dotted line) which results in a single node N2. Shorting the various spinning current contacts thus gives four nodes N1, N2, N3, N4. In a first operating phase electrical power is supplied between nodes N1 and N3 and the signal is tapped between N2 and N4. In a second operating phase electrical power is supplied between nodes N2 and N4 and the signal is tapped between N1 and N3. There is no need for switches or other electronic devices to short the contact 21-1 to 21-5 to the node N1; this is done merely via a low ohmic conductor like aluminum wires or strips on the die. In this manner it may be avoided that switches add resistances that are different in the first and second operating phases, as this could give rise to errors in the spinning current technique.

The idea behind the vertical Hall sensor as shown in FIG. 6 is the following: there are several Hall devices in parallel: the first Hall device comprises contacts 21-1 (#1), 24-1 (#2), and 22-1 (#3). Using only the ordinal numbers to designate the contacts, the second Hall device comprises the contacts #3, #4, and #5. The third Hall device comprises the contacts #5, #6, and #7, etc. Finally, a ninth Hall device comprises the contacts #17, #18, and #19. Each Hall device has an individual stochastic offset (zero-point error). The connection of contacts effectively is a parallel circuit of all these devices. The total current splits up into nine substantial equal parts, each one flowing through one of the nine Hall devices. The outputs are also connected in parallel: this produces an average of all outputs. In particular, it produces an average of the total offset error: the mean total offset error is sqrt(9) times smaller than the offset of a single device.

Moreover, the parallel circuit of an odd number of individual Hall devices makes the total device more symmetric: in the first operating phase the positive supply contact 21-1 (#1) is close to one end of the Hall effect region 11, while a sense contact 23-5 (#20) is close to the opposite end of the Hall effect region 11. In the second operating phase we have similar conditions: the positive supply contact 23-5 (#20) is close to one end of the Hall effect region 11, while a sense contact 21-1 (#1) is close to the other end of the Hall effect region 11. Hence, the unavoidable asymmetries at the end of the Hall effect region(s) are substantially identical in both operating phases: consequently, they are likely to cancel almost completely if the signals of the first and the second operating phases are added/subtracted.

Furthermore, there is substantially no asymmetry between the first and the second operating phases for the inner contact, just the (near perfect) exchange of supply contacts with sense contacts which gives a highly accurate spinning current technique.

Note that the current consumption increases by a factor of 9 compared with a single device. On the other hand, the noise decreases due to the very same fact. The current drain can be kept at a minimum if the contacts are small and the width of the contacts and of the Hall effect region(s) in y-direction are small.

Figure 7A:
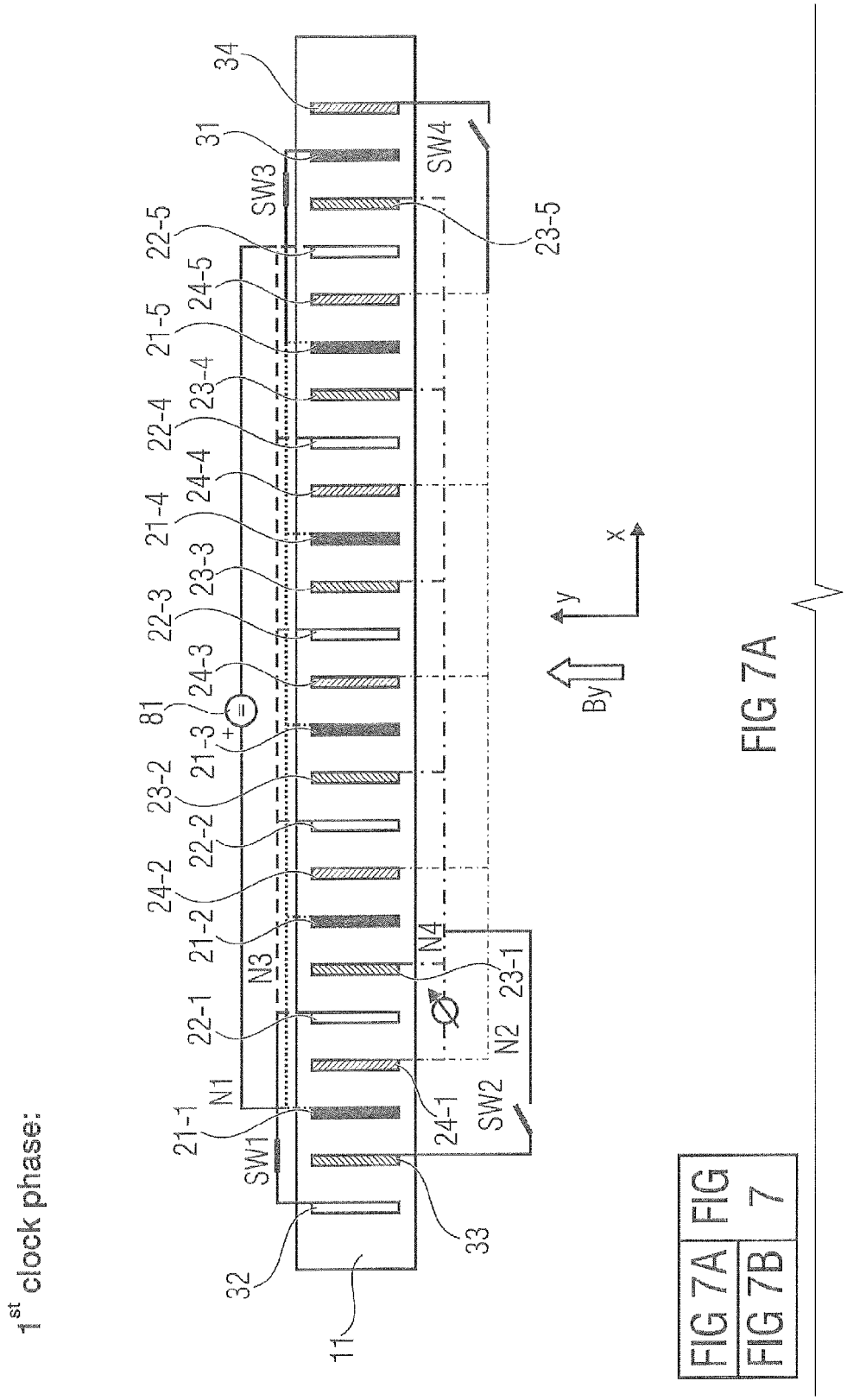
FIG. 7 shows schematic plan views of a vertical Hall sensor according to an embodiment of the disclosed teachings during a first and a second operating phase, respectively.
Figure 7B:
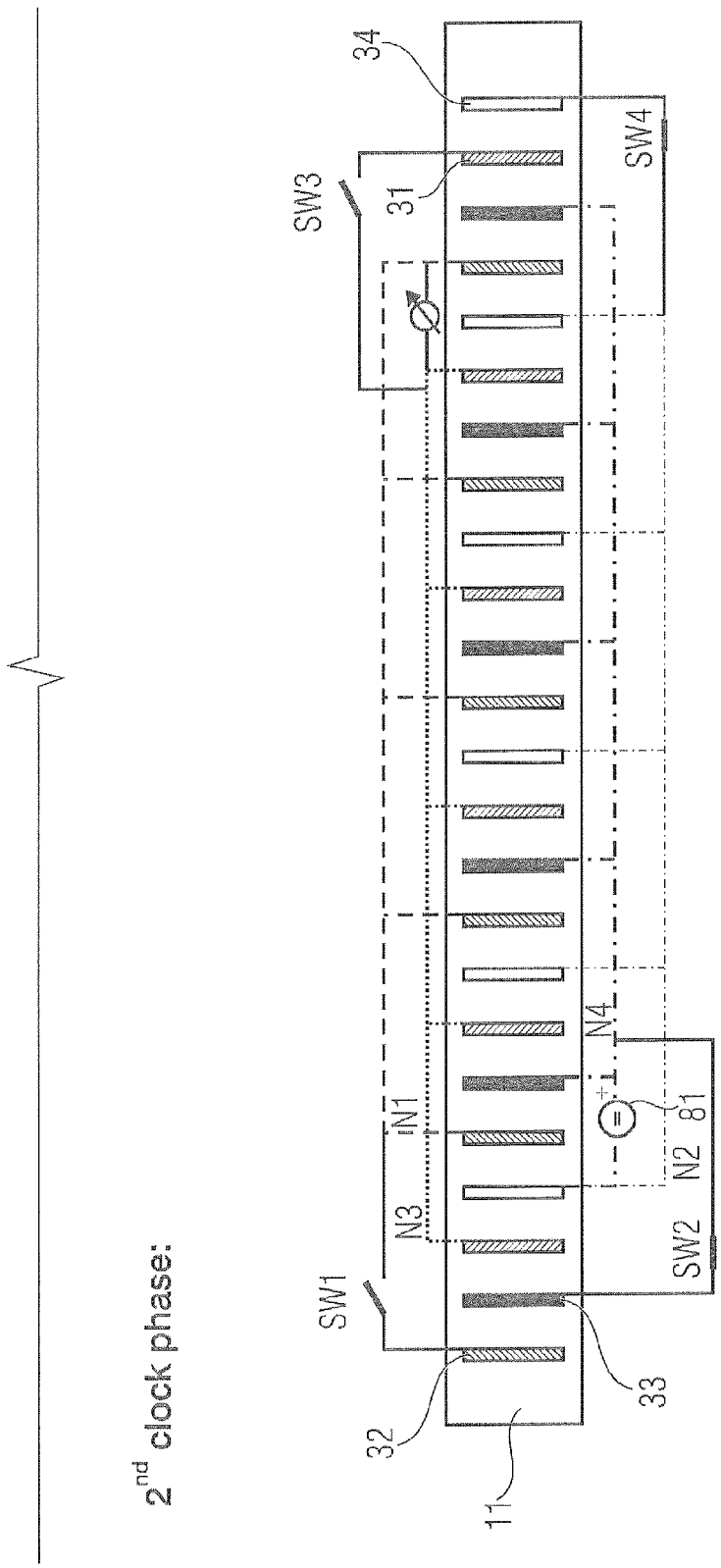

FIG. 7 shows schematic plan views of a vertical Hall sensor according to an embodiment of the teachings disclosed herein in a configuration for a first operating phase (top) and a configuration for a second operating phase (bottom). The vertical Hall sensor shown in FIG. 7 is derived from the vertical Hall sensor shown in FIG. 6.

The vertical Hall sensor shown in FIG. 7 comprises 24 substantially identical contacts that are arranged in or on the surface of the Hall effect region 11. Spinning current contacts are arranged in a central portion of a path extending between a first end (e.g., the left end) and a second end (e.g., the right end) of the Hall effect region 11, along which the plurality of contacts is arranged. The central portion substantially begins to the left of the spinning current contact 21-1 and ends substantially to the right of the spinning current contact 23-5. Two supply-only contacts 32, 33 are arranged to the left of the central portion and two other supply-only contacts 31, 34 are arranged to the right of the central portion. Each spinning current contact within the central portion is connected to one of four nodes N1, N2, N3, and N4, depending on its position in the sequence of the contacts. Reference is made to the description of FIG. 6 regarding this aspect. Each supply-only contact is connected to one of the nodes N1 to N4 via one of four switches SW1, SW2, SW3, and SW4. The supply-only contact 32 is connected via switch SW1 to the node N3. The supply-only contact 33 is connected via the switch SW2 to the node N4. The supply-only contact 31 is connected via the switch SW3 to the node N3. The supply-only contact 34 is connected via the switch SW4 to the node N2.

During the first operating phase, the supply-only contact 32 acts as a negative supply contact because the switch SW1 is closed and connected to the negative pole of the voltage supply 81. The supply-only contact 33 is left floating because the switch SW2 is open during the first operating phase. The supply-only contact 33 functions as a positive supply contact because the switch SW3 is closed so that a connection is made to the positive contact of the voltage supply 81. The supply-only contact 34 is left floating because the switch SW4 is open during the first operating phase.

When passing from the first operating phase to the second operating phase, the states of the switches S1 to S4 are toggled, i.e., switches SW1 and SW3 are open while the switches SW2 and SW4 are closed. Accordingly, the supply-only contacts 32 and 31 are floating during the second operating phase. The supply-only contact 33 functions as a positive supply contact because due to the closed switch SW2 the supply-only contact 33 is connected to the node N4 and thus to the positive pole of the voltage supply 81. The supply-only contact 34 functions as a negative supply contact during the second operating phase because the switch SW4 is closed so that the supply-only contact 34 is connected to the node N2 and the negative pole of the voltage supply 81.

The embodiment of the vertical Hall sensor shown in FIG. 7 has a higher symmetry than the vertical Hall sensor shown in FIG. 6. The higher symmetry comes, however, at the expense of slightly increased current consumption: with the four switches SW1 to SW4 one supply contact is added at the left and the right of the central portion, i.e., the spinning current contact, to prolong the range of potential symmetry at both ends of the Hall effect region 11.

Figure 8:
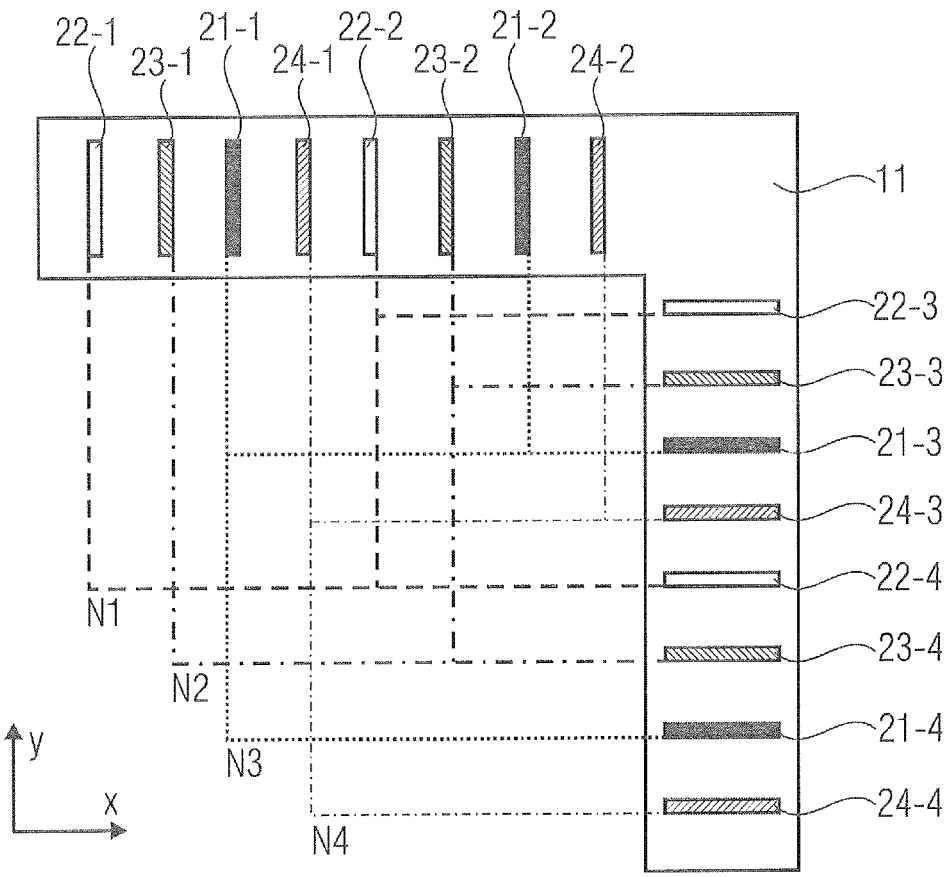
FIG. 8 shows a schematic plan view of a vertical Hall sensor with an L-shaped Hall effect region according to an embodiment of the disclosed teachings.
Figure 9:
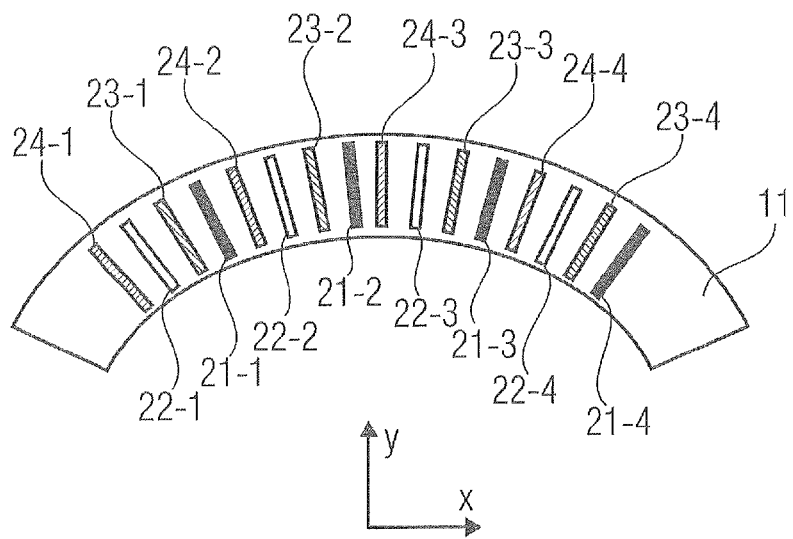
FIG. 9 shows a schematic plan view of a vertical Hall sensor having an arch-shaped Hall effect region according to an embodiment of the disclosed teachings.

FIGS. 8 and 9 show vertical Hall sensors having Hall effect regions 11 that are not straight. As a consequence, the paths that extend between a first end and a second end of the Hall effect region and along which the plurality of contacts is arranged, are not straight, either.

FIG. 8 shows a vertical Hall sensor in which the Hall effect region 11 has an L-shape. The vertical Hall sensor comprises 16 contacts, eight of which are formed in or on the surface of a portion of the Hall effect region 11 extending in the x-direction, and the remaining eight contacts are formed in or on the surface of a portion extending in the y-direction. Contacts having equal functions during a given operating phase of the spinning current scheme are mutually connected, thus forming a node. Typically, a spinning current contact may fulfill one of the following four functions: positive supply contact, negative supply contact, "positive" sense contact, and "negative" sense contact. The spinning current contacts 22-1 to 22-4 function as negative supply contacts during the first operating phase and are connected to the node N1. The spinning current contacts 23-1 to 23-4 function as positive sense contacts during the first operating phase and are connected to the node N2. The spinning current contacts 21-2 to 21-4 function as positive supply contacts during the first operating phase and are connected to the node N3. The spinning current contacts 24-1 to 24-4 function as negative sense contacts during the first operating phase and are connected to the node N4.

As with other vertical Hall sensors disclosed herein, the contacts are substantially identical. Furthermore, the contacts are arranged in an equidistant manner along a polygon curve, here the L-shape. An exception of the equidistant spacing between two adjacent contacts of the plurality of contacts is the distance between the two innermost contacts 24-2 and 22-3.

FIG. 9 shows another logical Hall sensor that also comprises 16 substantially identical contacts formed in or on the surface of a Hall effect region 11. The Hall effect region 11 is arc-shaped. The path extending between the first end and the second end of the Hall effect region 11 is also arc-shaped, i.e. a smooth curve. Other possible configurations of the Hall effect region 11 and the path could comprise piece-wise straight curves. Although not explicitly depicted in FIG. 9, the various spinning current contact may be mutually connected to each other in a similar manner as shown in FIG. 8. The spinning current contacts have an equidistant spacing along the path.

Figure 10:
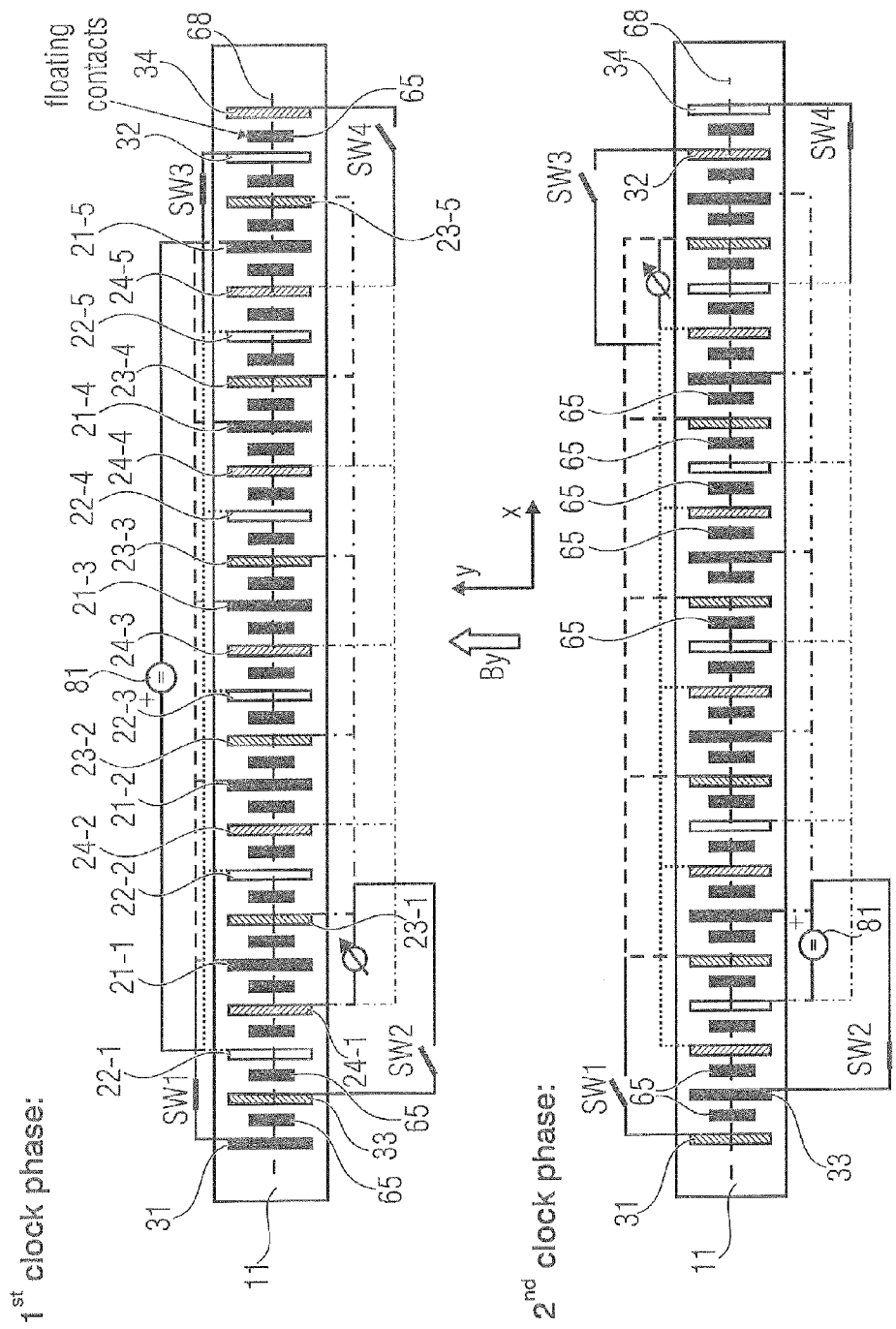
FIG. 10 shows schematic plan views of a Hall effect sensor according to an embodiment of the disclosed teachings during a first and a second operating phase, respectively.

FIG. 10 shows a schematic top view or plan view of a vertical Hall sensor according to an embodiment of the teachings disclosed herein. The vertical Hall sensor shown in FIG. 7 may be regarded as a predecessor for the embodiment shown in FIG. 10. The spinning current contacts 21-$i$, 22-$i$, 23-$i$, and 24-$i$ are referred to as first type contacts in the context of the description of FIG. 10 and FIG. 11. The supply-only contacts 31 to 33 are also referred to as first type contacts. Between these contacts of the first type, which are connected to the nodes N1 to N4, additional contacts 65 may be inserted. These contacts of a second type are typically located in a symmetric manner between the contacts of the first type. One or several of the second type contacts 65 may be situated between each two contacts of the first type. The second type contact 65 may have another shape or form than the first type contact: in the embodiment of FIG. 10 the second type contacts 65 are only half as wide as the first type contacts. An effect of the second type contacts 65 as they are shown in FIG. 10 is that they pull the current flow towards a middle line 68 of the Hall effect region 11. Furthermore, they pull the current flow towards the surface of the Hall effect region 11, i.e., they prevent that the current flows too much into the depth. This may be important for cases in which a semiconductor manufacturing process forms a highly conductive buried layer, such as an n+ doped buried layer (nBL) which could pull the current towards the depth and cause a short-circuit. The first aspect of pulling the current flow towards the middle line 68 of the Hall effect region may be important when it is not possible that the contacts of the first type, i.e., the spinning current contacts, extend over the entire width of the Hall effect region: in this case, the magnetic sensitivity is reduced due to components of the currents that flow in the y-direction. In order to reduce/prevent these current components, the second type contacts 65 are arranged close to the middle line 68, which pull the current towards the middle.

Figure 11:
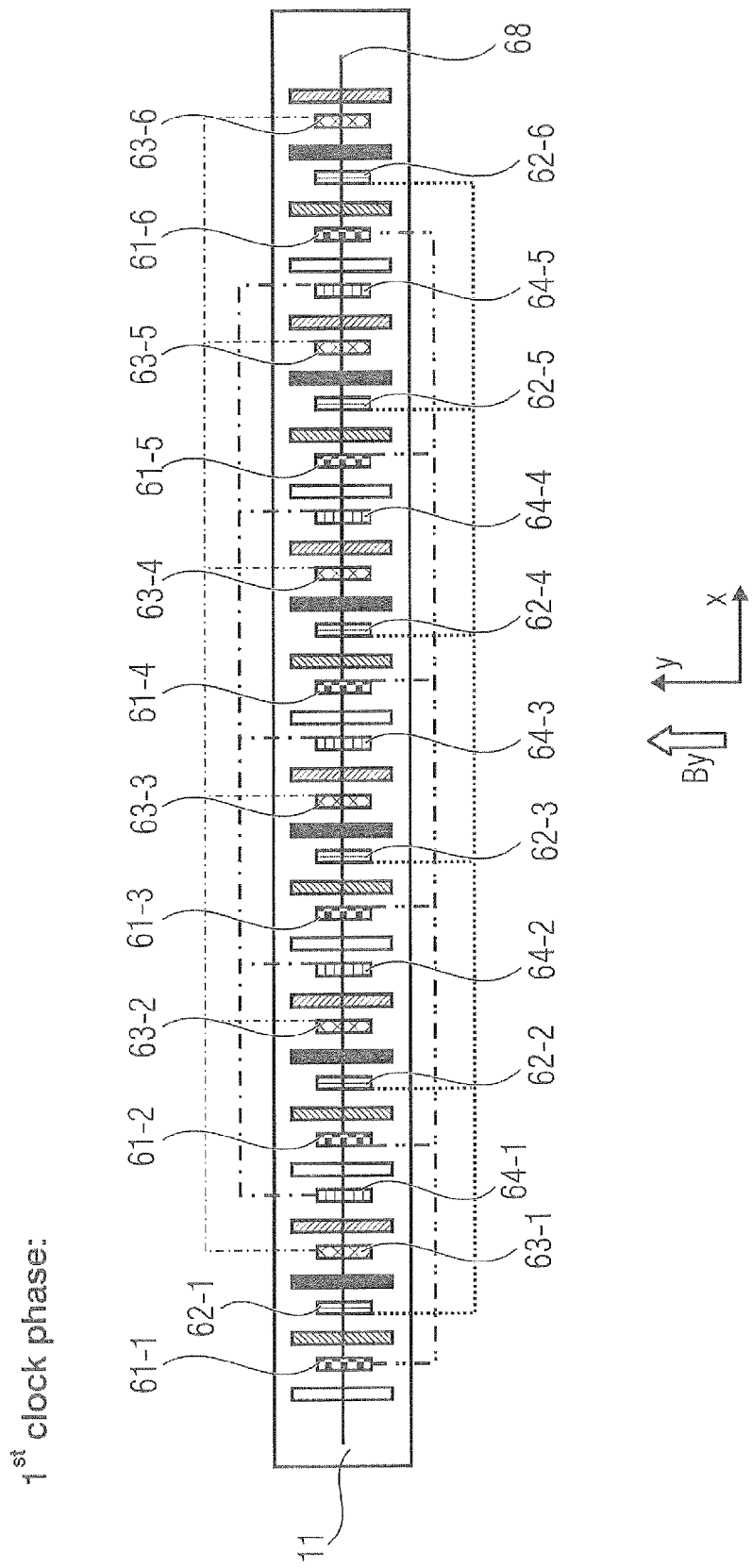
FIG. 11 shows a schematic plan view of a vertical Hall sensor according to an embodiment of the disclosed teachings similar to the one shown in FIG. 11.

As shown in FIG. 11, the second type contacts or floating contacts 65 may also be connected to each other in a similar manner as the first type contacts. FIG. 11 shows a schematic plan view of a vertical Hall device according to an embodiment of the teachings disclosed herein during the first operating phase. Second type contacts that are to the right of a negative supply contact have the reference signs 61-1 to 61-6. Second type contacts that are to the right of a positive sense contact have the reference signs 62-1 to 62-6. Second type contacts that are to the right of the positive supply contacts have the reference signs 63-1 to 63-6. Second type contacts that are to the right of negative sense contacts have the reference signs 64-1 to 64-6. The second type contacts with the reference signs 61-1 to 61-6 are connected to each other and thus form one floating node. The remaining second type contacts are also connected to each other in groups, thus forming three other floating nodes. By connecting a second type contact to other second type contacts the individual second type contacts are actually not floating anymore in the sense of a single contact. Nevertheless, the connected second type contacts are floating as a network node because they are not externally connected to other circuit elements. The nodes N1 to N4 connecting the spinning current contacts have been omitted from illustration in FIG. 11 for the sake of clarity.

In both FIGS. 10 and 11 the Hall effect region 11 is elongated and may be a tub formed in a substrate. On the surface of the Hall effect region 11 contacts of the first and second types may be placed so that between each two contacts of the first type there are M contacts of the second type (M=1 is possible, as well). All contacts are numbered along the Hall effect region 11 in ascending order. The contacts 1, 1+4*(1+M), 1+2*4*(1+M), ... 1+N*4*(1+M) are connected with the node N1. The contacts 2+M, 2+M+4*(1+M), 2+M+2*4*(1+M), ..., 2+M+N*4*(1+M) are connected with the node N2. The contacts 3+2*M, 3+2*M+4*(1+M), 3+2*M+2*4*(1+M), ..., 3+2*M+N*4*(1+M) are connected with the node N3. Finally, the contacts 4+3*M, 4+3*M+4*(1+M), 4+3*M+2*4*(1+M), ..., 4+3*M+N*4*(1+M) are connected with the node N4.

Typically, the number of first-type contacts is at least eight. In the alternative, the number could be 12 or 16, which is expected to lead to a better performance of the vertical Hall sensor, in particular with respect to a reduction of the zero-point error.

As shown in FIGS. 8 and 9, the Hall effect region does not necessarily have to be straight, i.e., the contacts do not necessarily have to be arranged along a straight line or path. The Hall effect region 11 simply has to be elongated and its longitudinal direction may be a smooth curve (a segment of a circle or an ellipse or it may have a L-shape (or a polygon section). The contacts may then be arranged in a sequence along this curve.

The connection of individual contacts to a node may be hard-wired which means that in the operating phases of the spinning current scheme the connections do not have to be changed (it does not necessarily have to be a fixed wiring by means of a conductor, but it could also be an electronic element such as a MOS switch which, however, must not be opened in one operating phase and closed in another operating phase).

Typically, the number of the first type contacts is an even number.

In the following FIGS. 12a to 14b several vertical Hall sensors are introduced which achieve a high degree of symmetry by means of a ring-shaped Hall effect region. In particular, the contacts of the vertical Hall sensors shown in FIGS. 12a to 14b are highly symmetric to each other, because a ring has no start and no end. Therefore, no distinction has to be made within the plurality of contacts as to which contacts count as "inner" contacts and which count as "outer" contacts. Boundary effects affecting the function of the contacts, for example with respect to a distribution of an electric current or an electric potential within the Hall effect region, are substantially the same for all contacts.

Figure 12A:
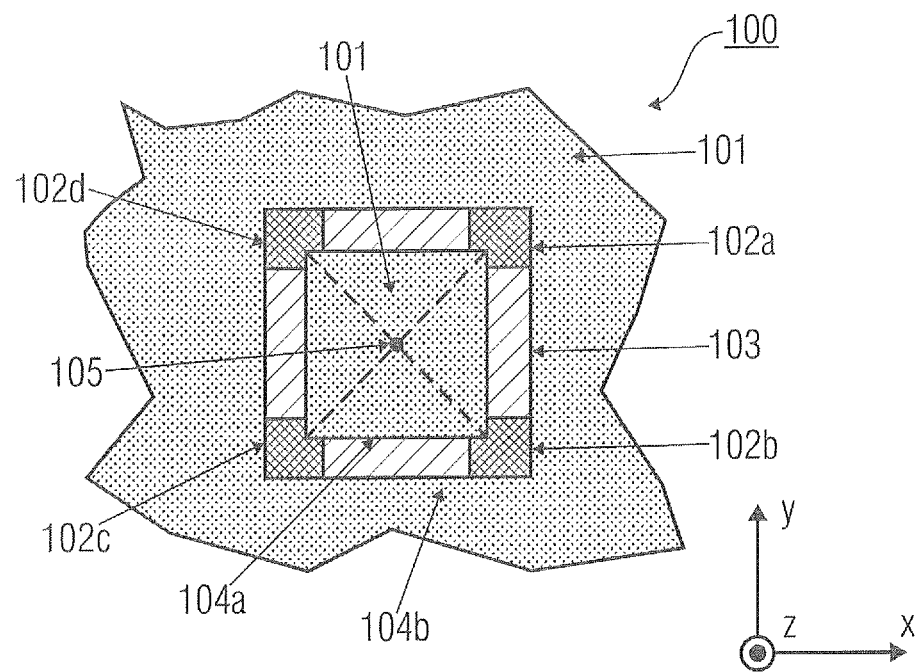
FIG. 12a shows a schematic plan view of a vertical Hall sensor having a square, ring-like Hall effect region.

FIG. 12a shows a schematic layout or plan view of a ring-shaped vertical Hall element 100. The ring-shaped vertical Hall element 100 may be formed in a substrate 101 that may be, for example, a p-doped semiconductor or an isolating material. A ring-shaped tub or well 103 is formed within the substrate 101, for example by n-doping the substrate 101 at locations where the ring-shaped tub 103 is to be formed. The ring-shaped tub has a 90° symmetry referred to a center 105 of the ring-shaped tub 103. As an alternative, the ring-shaped tub 103 could have a higher symmetry (e.g., octagonal or circular shapes). Four contacts 102a, 102b, 102c, 102d are formed in or on a surface of a ring-shaped tub 103. By means of the four contacts 102a to 102d electric connections can be made to the tub 103 at various locations thereof. The four contacts 102a to 102d essentially extend from an inner perimeter 104a to an outer perimeter 104b of the ring-shaped tub 103.

The surface of the substrate 101 is parallel to the xy-plane. The ring-shaped vertical Hall element 100 is typically indicative of magnetic field components parallel to the xy-plane. Magnetic field components parallel to the z-direction should not have significant influence on the output signal of the device 100.

The device 100 is shown to have two portions of the ring parallel to the x-axis and two portions of the ring parallel to the y-axis. Other ring-shaped vertical Hall elements may be rotated by an arbitrary angle around the symmetry center 105. For example, another ring-shaped vertical Hall device 100 may have portions of the ring at +/−45° to the x-axis and y-axis.

The four contacts 102a to 102d may be configured as spinning current contacts with the contacts 102a and 102c being supply contacts and the two other contacts 102b and 102d being sense contacts during the first operating phase of the spinning current scheme, for example.

Figure 12B:
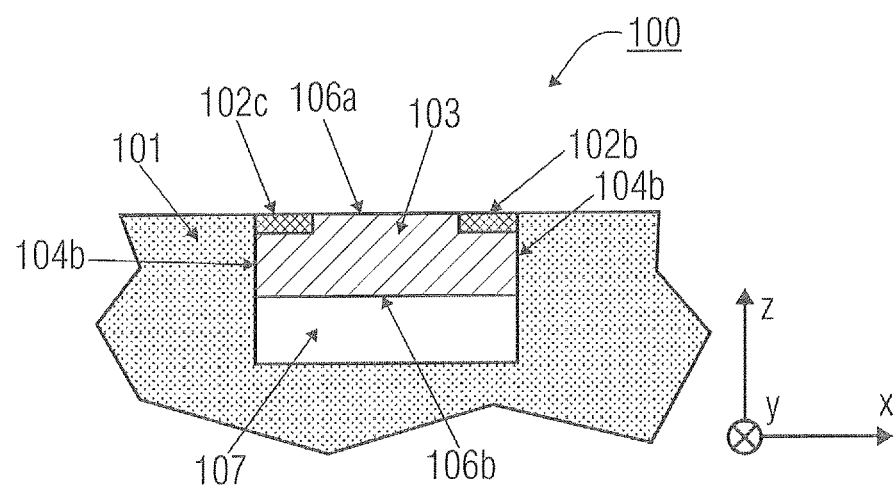

FIG. 12b shows a schematic cross-section of the device along the x-axis and through the contacts 102b and 102c. It can be seen that the contacts 102c and 102b are formed in a surface 106a of the tub 103 and are shallower than the tub 103. As the device 100 is symmetric, the same holds for the two other contacts 102a and 102d which cannot be seen in FIG. 12b. In order to give an idea of the dimensions involved, the following information is provided: the tub 103 may be about 5 µm thick in the z-direction, whereas the contacts 102a to 102d are typically less than 1 µm thick (preferably 0.2 µm thick) in one embodiment. Other possible dimensions are, for example: tub thickness of 2 µm, 3 µm, 4 µm, 6 µm, 7 µm, or 8 µm and contact thickness of 0.05 µm, 0.1 µm, 0.5 µm, or 0.8 µm. The tub 103 may be lightly n-doped with a dose of $10^{15}$ cm$^{-3}$ to $10^{17}$ cm$^{-3}$ whereas the contacts 102a to 102d may be strongly n-doped with a dose of more than $10^{17}$ cm$^{-3}$ (e.g. $10^{19}$ cm$^{-3}$). The tub 103 may be identical to an n-epitaxial layer of current CMOS processes, where the contacts 102a to 102d may be identical to shallow n$^+$ S/D source-drain contacts. The contacts may be reinforced by additional n-CMOS wells. At a bottom 106b of the tub 103 there may be a buried layer 107 as is the case for robust BiCMOS/CMOS processes, but this is not necessarily so. In case of an epitaxial layer it is often the case that trenches isolate the epitaxial layer and the tub 103 laterally from the substrate 101 (these trenches are not shown in FIGS. 12a to 12c).

Figure 12C:
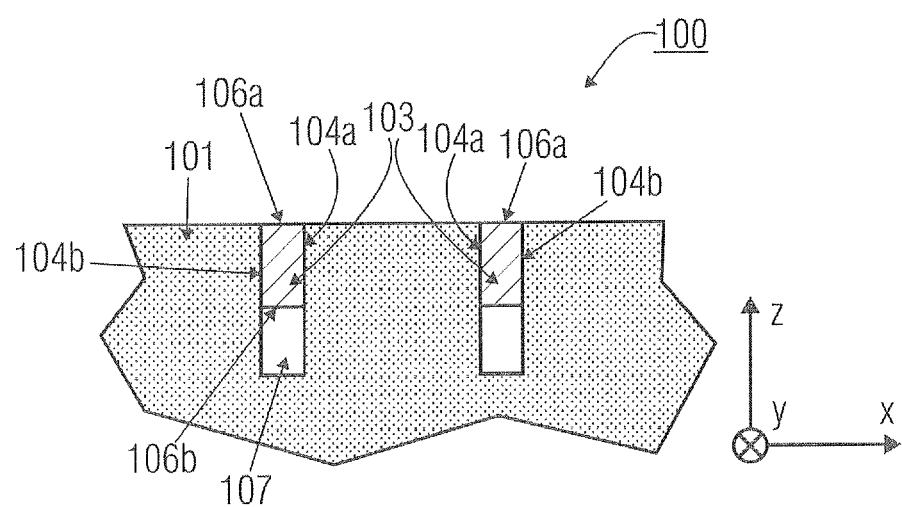

FIG. 12c shows a schematic cross-section of the device along the x-axis and through the center point or symmetry center 105 of the device. The two portions of the tub 103 extending in the y-direction can be seen in this cross-section. During operation, an electric current flows through these portions in the y-direction, i.e., perpendicular to the drawing plane. The total section of each portion is the width of the portion times the depth of the tub 103. The width is equal to the distance between the inner perimeter 104a and the outer perimeter 104b of the ring-shaped tub 103. However, when the optional n-buried layer 107 is present, a significant portion of the electric current is likely to flow within the n-buried layer 107.

Figure 13A:
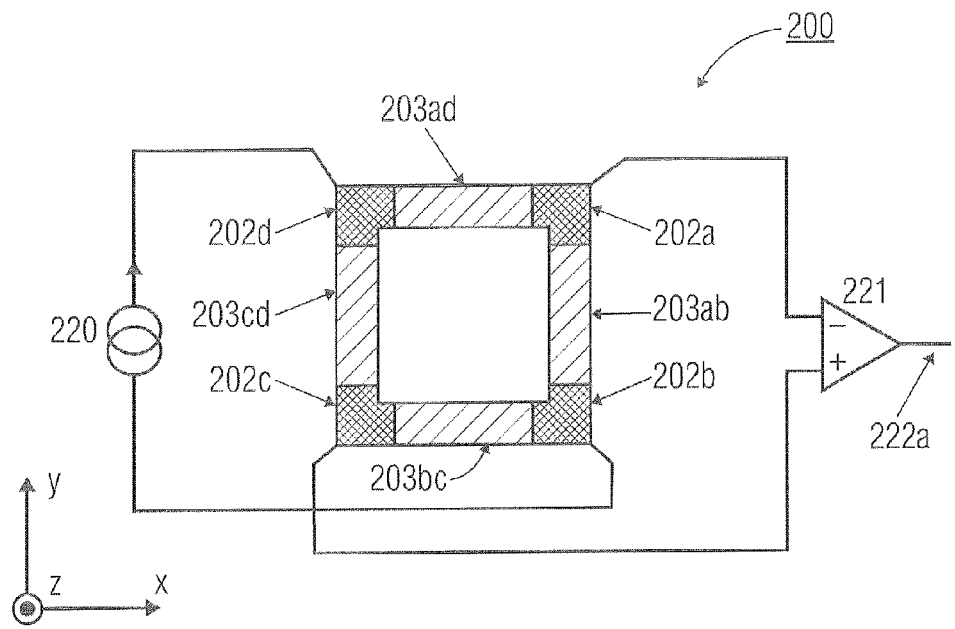
FIGS. 13a, 13b show a vertical Hall sensor having a square, ring-like Hall effect region in a first operating state and a second operating state of the spinning current scheme.

FIG. 13a shows a schematic layout or plan view of a ring-shaped vertical Hall device 200. FIG. 13a also shows schematically how it is connected in a circuit. Two diagonally opposite contacts 202b and 202d are connected to an electric supply 220. The electric supply can be a current or a voltage source; a current source 220 is shown in FIG. 13a. At the other two diagonally opposite contacts 202a and 202c the output signal 222a is measured. The output signal 222a can be the output voltage measured with a high-impedance volt meter 221. As an alternative, an output current could be measured by means of a low-impedance ampere meter.

In cases in which no magnetic field is present, the output voltage would ideally be 0: half the current flows between the contacts 202b and 202d over the right branch of the ring that contains the contact 202a, whereas the other half of the current flows between the contacts 202b and 202d over the left branch of the ring that contains the contacts 202c. In practice the output voltage is usually different from 0 due to unavoidable asymmetries in the geometry or in the connectivity of the device 200.

If there is a magnetic field component Bx<>0 while By=0, this field acts on the charge carriers flowing through branches 203cd and 203ab. If there is a magnetic field component By<>0 while Bx=0, this field acts on the charge carriers flowing through branches 203ad and 203bc.

Suppose Bx>0 and By=0: if the current flows into the contact 202d and out of the contact 202b, then the electrons in the tubs 203ab and 203cd mainly flow in positive y-direction. Strictly speaking, the electrons flow in semi-arcs because they enter the tub at the contact 202b and flow simultaneously into the depth (=negative z-direction=into the drawing plane) of the tub 203ab and toward the contact 202a. After approximately half of the length of the tub portion 203ab, the electrons flow up toward the surface where the contact 202a is (=in positive z-direction=out of the drawing plane). Due to the Lorentz-Force of the Bx-fields on the electrons, they are pulled towards the surface of the tub (106a in FIGS. 12b, 12c). This is due to the Hall effect: the Hall effect pulls the electrons on smaller, shallower semi-arcs. This happens in both tubs 203ab and 203cd. Consequently, the electric potential at the contact 202a is lowered, whereas the electric potential at contact 202c is raised and therefore the signal 222a increases due to the action of a positive Bx-field. Note that the output signal 222a is positive if the input signal at the non-inverting input denoted with a "+" is larger than the input signal at the inverting input denoted with a "−".

Suppose now that the magnetic field in the y-direction By>0 and Bx=0: the Lorentz-Force on the electrons flowing through the tub portions 203ad and 203bc again pulls them to the surface of the tub, which decreases the resistance of these tubs. The electrons flowing in the other two branches of the tub, i.e., the tub portions 203ab and 203cd, are not affected by the By-component because it is parallel to the drift velocity. Consequently, the electric potential at the contact 202a is raised and the electric potential at the contact 202c is lowered so that the signal 222a decreases.

In summary, the output signal 222a is proportional to the difference of the magnetic field components in the x- and y-directions Bx and By: $S_{out(222a)}=K^*(Bx-By)$ with K>0. The factor of proportionality K is equal for both components Bx and By as long as the device has at least a 90° symmetry (in our case the tub portion 203ad is equally long as the tub portion 203ab). Changing the current direction causes the output signal $S_{out(222a)}$ to change its sign.

Figure 13B:
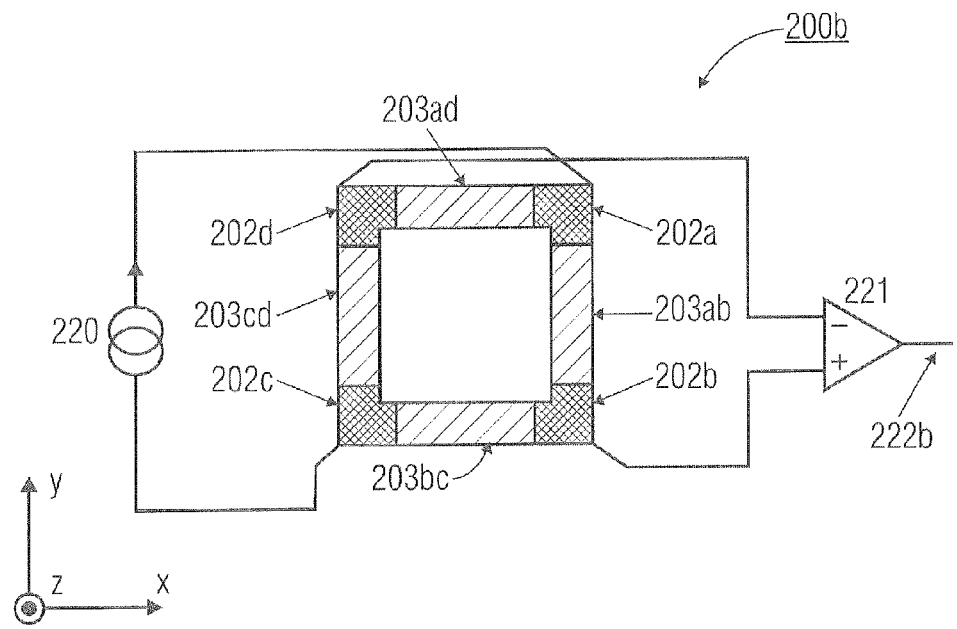

Exchanging or swapping the inputs and outputs of the ring-shaped vertical Hall device results in the situation shown in FIG. 13b. If Bx>0 and By=0, the resistances of the tub portions 203ab and 203cd decrease and the output signal 222b is positive. If By>0 and Bx=0, the resistances of the tub portions 203bc and 203ad increase and the output signal 222b is positive. The output signal during the second operating phase which is illustrated in FIG. 13b thus depends on the magnetic field components in the x- and y-directions Bx and By, thus $S_{out(222b)}=K^*(Bx+By)$.

The output signals of both operating phases can be subtracted: $S_{out(222a)}-S_{out(222b)}=K^*(Bx-By)-K^*(Bx+By)=(-2)^*K^*By$.

At the same time, a zero-point error cancels or is significantly reduced, as is shown next: suppose that the tub portion 203ab is slightly longer than the other branches of the device. At vanishing magnetic fields we get $S_{out(222a)}=(-1)^*$Off and $S_{out(222b)}=(-1)^*$Off with Off>0. Therefore, the offset Off vanishes if the two signals for the two operating phases are subtracted: $S_{out(222a)}-S_{out(222b)}=0$ (for Bx=By=0). Hence, the difference of the signal $S_{out(222a)}-S_{out(222b)}$ is proportional to the By field and it is at the same time substantially free of the zero-point errors of the device. This is the spinning current principle applied to ring-shaped vertical Hal devices.

The current direction can be reversed in both FIGS. 13a and 13b in order to have a total of four measuring points for all four current directions. If all four values are subtracted an even better spinning current method can be obtained with an output signal that is still proportional to the magnetic field component in the y-direction By.

Generally, the connections can be changed in many permutations and it is also possible to rotate the device on the wafer so that the portions of the tub 103, 203 may be at an angle to the x-axis different from 0° and 90°. The magnetic field components in the x-direction Bx and the y-direction By can be measured separately and simultaneously a very low offset error or zero-point error can be achieved.

Figure 14A:
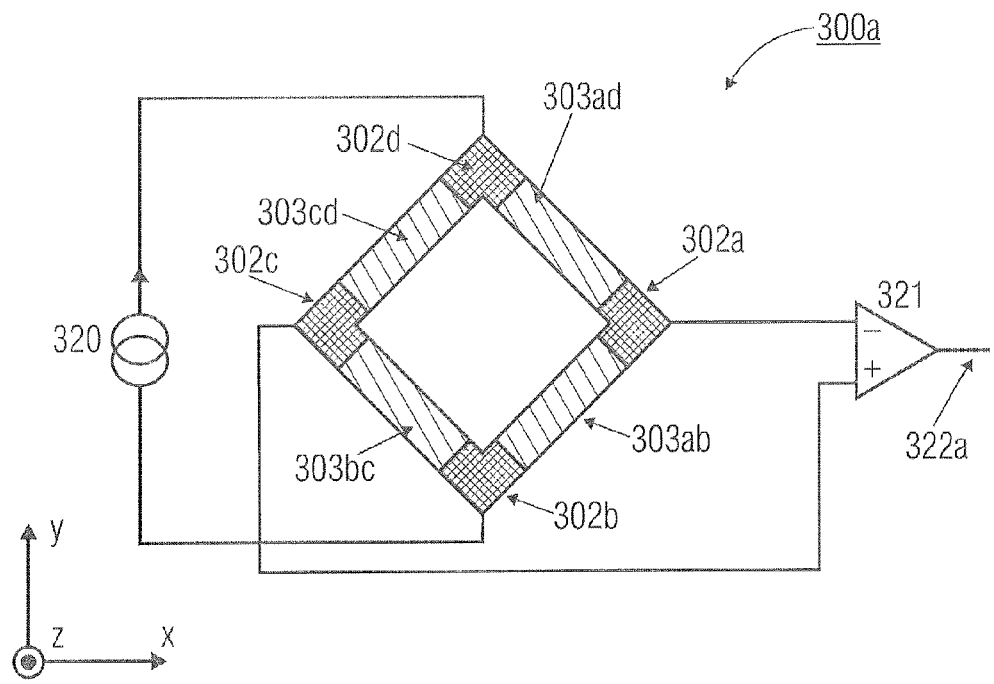
FIGS. 14a, 14b show another vertical Hall sensor having a ring-like, square Hall effect region during a first operating phase and a second operating phase, respectively.
Figure 14B:
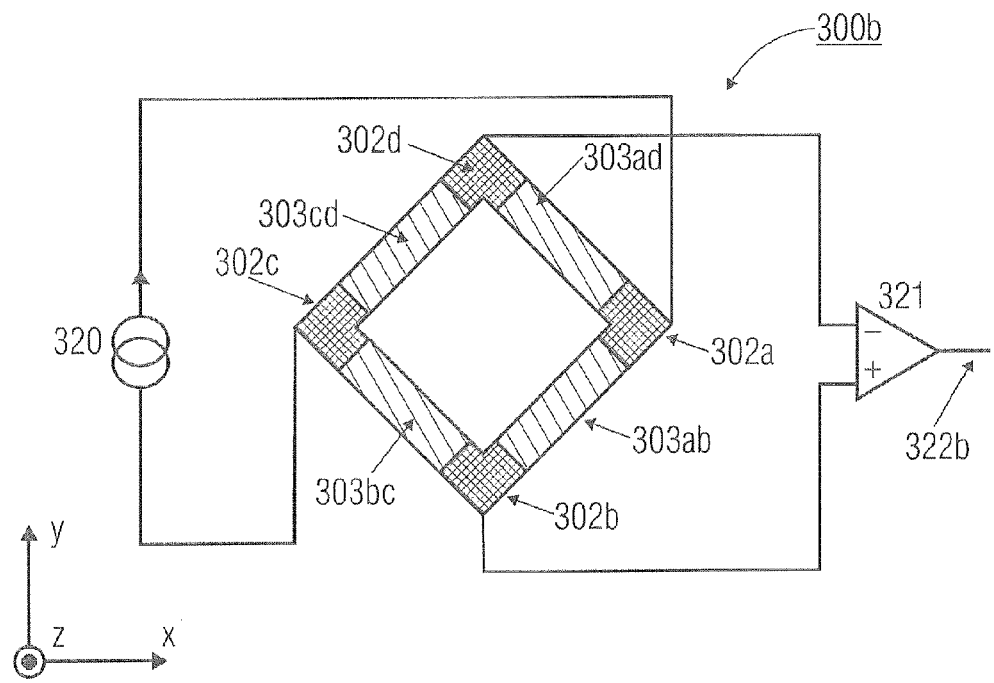

FIGS. 14a and 14b show another ring-shaped Hall device 300a, 300b which is rotated by 45° compared to the ring-shaped Hall device 200a, 200b shown in FIGS. 13a and 13b. The abbreviations nx and ny are used to designate the unit vectors in the x-direction and the y-direction, respectively. If the magnetic field points into the direction (nx+ny)/sqrt(2), the resistances of the tub portions 303ad and 303bc decrease and thus the output signal 322a is negative.

If the magnetic field points into the direction (nx−ny)/syrt(2) the resistances of the tub portions 303ab and 303cd decrease and thus the output signal 322a is positive.

From this it follows that $S_{out(322a)} = -K^*(Bx+By)/\sqrt{2} + K^*(Bx-By)/\sqrt{2} = -\sqrt{2}*K^*By$ with K>0.

Exchanging or swapping the inputs and the outputs of the device leads to the configuration which is shown in FIG. 14b that is used during the second operating phase of the spinning current scheme, for example.

If the magnetic field points into the direction (nx+ny)/sqrt(2), the resistances of the tub portions 303ad and 303bc increase and thus the output signal 322b is positive.

If the magnetic field points into the direction (nx-ny)/sqrt(2), the resistances of the tub portions 303ab and 303cd decrease and thus the output signal 322b is positive.

It follows that $S_{out(322b)} = K^*(Bx+By)/\sqrt{2} + K^*(Bx-By)/\sqrt{2} = \sqrt{2}*K^*Bx$ with K>0.

As with the ring-shaped vertical Hall device 200a, 200b shown in FIGS. 13a, 13b, the zero-point error or offset can be significantly reduced which can be demonstrated by similar calculations. Supposing again that the tub portion 303ab is slightly longer than the other branches, at zero magnetic field the two output signals for the two operating phases are: $S_{out(322a)} = (-1)^*Off$ and $S_{out(322b)} = (-1)^*Off$ with Off>0.

Therefore, this zero-point error can be cancelled by subtracting the output signals of the two operating phases; $S_{out(322a)} - S_{out(322b)}$. This leads to the following equation:

$$S_{out(322a)} - S_{out(322b)} = -2^*K^*By/\sqrt{2} - 2^*K^*Bx/\sqrt{2} = -\sqrt{2}*K^*(Bx+By).$$

The ring-shaped vertical Hall devices 200 and 300 shown in FIGS. 13a, 13b and 14a, 14b, respectively, may be combined to form a measurement system. Such a measurement system including both devices 200 and 300 is capable of computing the magnetic field components Bx and By separately. It is possible to arrange both devices side-by-side. Yet, one may also place one device inside the inner perimeter of the other device in order to have identical centers of symmetry 105.

The vertical Hall sensors or devices disclosed herein may be modified or further specified by means of one or more of the following configurations, structures, and/or measures. One or more p-isolation tubs may be inserted between the n⁺ contacts, i.e., between any two or more contacts that are formed in or on the surface of the Hall effect region or tub. The p-isolation tubs may be used to achieve a certain desired current density distribution within the Hall effect region or tub, for example by preventing that a significant portion of the electric current flows near the surface of the Hall effect region or tub.

Especially with respect to the ring-shaped vertical Hall devices 100, 200, 300 shown in FIGS. 12a to 14b, the tubs may be circular or octagonal. As another option, a multitude of ring-shaped vertical Hall devices may be used. The multitude of ring-shaped vertical Hall devices may be arranged in an array, a grid, or a cross-shaped arrangement, for example.

The vertical Hall sensors or devices may comprise an n⁺ buried layer (nBL) or not. If an n⁺ buried layer is present, this n⁺ buried layer may be interrupted between the different sections of a Hall effect region or portions of a tub, if this is technologically feasible with the semiconductor manufacturing process used for manufacturing a particular vertical Hall effect sensor or device.

With respect to the ring-shaped vertical Hall devices, the number of contacts may be reduced to three contacts only. In this case, the ring-shaped vertical Hall device would comprise two supply contacts and only one sense contact. Instead of measuring a differential sense signal between two sense contacts, a sense signal would be measured at the single sense contacts referred to a reference potential, such as a ground potential.

Figure 15:
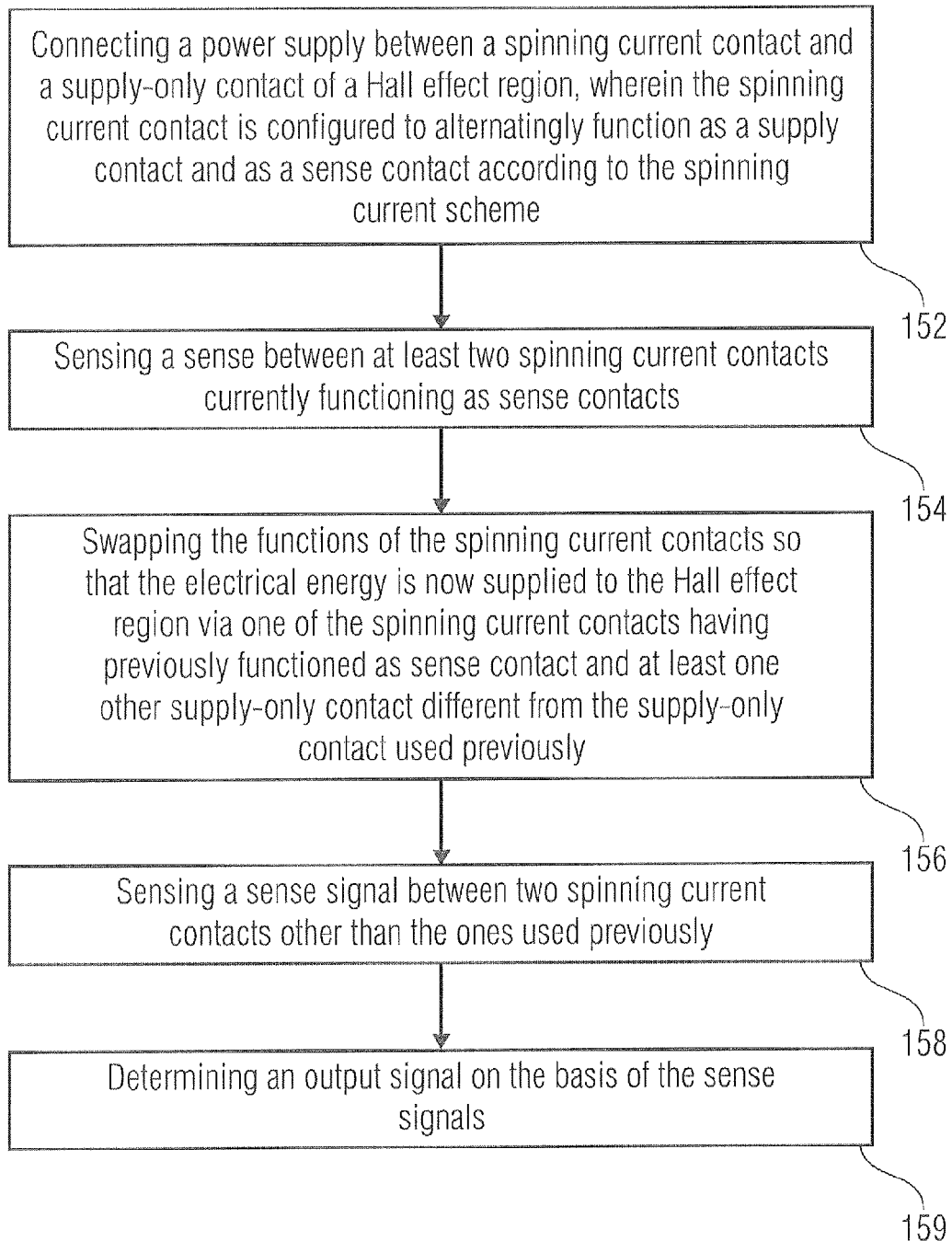
FIG. 15 shows a schematic flow diagram of a magnetic sensing method according to an embodiment of the disclosed teachings.

FIG. 15 shows a schematic flow diagram of a magnetic sensing method according to an embodiment of the teachings disclosed herein. During a first action 152 a power supply is connected between a spinning current contact and a supply-only contact of a Hall effect region. The spinning current contact is configured to function alternatingly as a supply contact and as a sense contact according to the spinning current scheme. The spinning current contact and the sense contact belong to a plurality of contacts formed in or on the surface of the Hall effect region of a vertical Hall sensor comprising at least four spinning current contacts and at least two supply-only contacts. The contacts are arranged in a sequence along a path extending between a first end and a second end of the Hall effect region, wherein the at least four spinning current contacts are arranged along a central portion of the path, and wherein the at least two supply-only contacts are arranged on both sides of the central portion in a distributed manner. The supply-only contacts are configured to supply electrical energy to the Hall effect region according to an extension of the spinning current scheme for supplying electrical energy to the Hall effect region.

A sense signal is sensed during an action 154 between at least two spinning current contacts currently functioning as sense contacts.

Then, at an action 156, the functions of the spinning current contacts are swapped so that the electrical energy is now supplied to the Hall effect region via one of the spinning current contacts that has previously functioned as a sense contact and at least one other supply-only contact different from the supply-only contact used previously, i.e., during the actions 152 and 154.

During an action 158 another sense signal is sensed between two spinning current contacts other than the ones used previously as sense contacts.

At an action 159 an output signal is determined on the basis of the sense signals obtained during the actions 154 and 158. The magnetic sensing method may then be repeated for another cycle of the spinning current scheme.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A vertical Hall sensor, comprising:
a Hall effect region;
a plurality of contacts formed in or on a surface of the Hall effect region, the contacts being arranged in a sequence along a path extending between a first end and a second end of the Hall effect region;
wherein the plurality of contacts comprise at least four spinning current contacts and at least two supply-only contacts;
wherein the spinning current contacts are configured to alternatingly function as supply contacts and sense contacts according to a spinning current operation;
wherein the at least four spinning current contacts are arranged along a central portion of the path; and
wherein the at least two supply-only contacts are arranged on opposing sides of the central portion in a distributed manner and are configured to supply electrical energy to the Hall effect region;
wherein two of the at least four spinning current contacts and one of the at least two supply-only contacts are configured to supply electrical energy to the Hall effect region and two other spinning current contacts are configured to function as sense contacts during a first operating phase of the spinning current operation, and wherein the two spinning current contacts functioning as sense contacts during the first operating phase and the other of the at least two supply-only contacts are configured to supply electrical energy to the Hall effect region during a second operation phase of the spinning current operation, and wherein the two spinning current contacts having functioned as supply contacts during the first operating phase are configured to function as sense contacts during a second operating phase of the spinning current operation.

2. The vertical Hall sensor according to claim 1, wherein the Hall effect region is elongated and has one of a straight shape, a curved shape, an angled shape, an L-shape, an arched shape, and a piece-wise straight shape.

3. The vertical Hall sensor according to claim 1, wherein the plurality of contacts comprises at least four of the supply-only contacts so that during at least two operating phases of the spinning current operation at least one supply-only contact at each side of the central portion is configured to supply electrical energy to the Hall effect region.

4. The vertical Hall sensor according to claim 1, wherein the at least two supply-only contacts comprise two outermost supply-only contacts that are spaced apart from the first end and the second end by a distance greater than a maximal spacing of the at least four spinning current contacts.

5. The vertical Hall device according to claim 1, wherein a length of the Hall effect region is greater than a length of the central portion by a factor comprised in a range between 1.2 and 20.

6. The vertical Hall sensor according to claim 1, further comprising at least two floating contacts, wherein a first of the at least two floating contacts is formed in or on the surface of the Hall effect region between the first end and one of the at least two supply-only contacts that is closer to the first end than the other(s) of the at least two supply-only contacts; and
wherein a second floating contact of the at least two floating contacts is formed in or on the surface of the Hall effect region between the second end and one of the at least two supply-only contacts that is closer to the second end than the other(s) of the at least two supply-only contact.

7. The vertical Hall sensor according to claim 1, wherein the at least four spinning current contacts comprise an odd number of spinning current contacts equal to or greater than seven,
wherein during at least one operating phase of the spinning current operation an even number equal to or greater than four of the spinning current contacts are configured to function as sense contacts, and
wherein differential sense signals are tapped between pairs of the spinning current contacts functioning as sense contacts during said operating phase, wherein the pairs are arranged along the path in a nested manner.

8. The vertical Hall sensor according to claim 1, further comprising a further Hall effect region in, or on a surface of which, is formed a further plurality of contacts similar to the plurality of contacts formed in or on the surface of the Hall effect region,
wherein the further plurality of contacts is configured to function in a complementary manner to the plurality of contacts, and wherein during each operating phase of the spinning current operation at least one first sensor signal is tapped between at least two of the spinning current contacts of the plurality of contacts formed in or on the surface of the Hall effect region and at least one second sense signal is tapped between at least two spinning current contacts of the further plurality of contacts formed in or on the surface of the further Hall effect region, and wherein the at least one first sense signal and the at least one second sense signal are added or subtracted from each other by an output signal determiner of the vertical Hall sensor.

9. The vertical Hall sensor according to claim 1 further comprising a further Hall effect region and a further plurality of contacts formed in or on the surface of a further Hall effect region, the plurality of contacts and the further plurality of contacts being substantially similar;
wherein at least one sense signal is tapped between a spinning current contact formed in or on the surface of the Hall effect region and a spinning current contact formed in or on the surface of the further Hall effect region, both functioning as a sense contact during a same operating phase of the spinning current operation.

10. The vertical Hall sensor according to claim 9,
wherein the further Hall effect region is substantially parallel to the Hall effect region, and wherein the spinning current contacts of the Hall effect region and the further Hall effect region between which the sense signal is tapped have a corresponding position within the plurality of contacts and the further plurality of contacts, respectively, and
wherein a plurality of the spinning current contacts functioning as supply contacts and of the supply-only contact is inversed between the Hall effect region and the further Hall effect region for a particular operating phase of the spinning current operation, so that directions of electrical current flow are opposite to each other in corresponding portions of the Hall effect region and the further Hall effect region.

11. The vertical Hall sensor according to claim 1, wherein the at least two supply-only contacts comprise at least four switched supply-only contacts, each one of the at least four switched supply-only contacts being connected, through a switching element, to at least one of the at least four spinning current contacts.

12. The vertical Hall sensor according to claim 1, further comprising a plurality of floating contacts, wherein M floating contacts are arranged between every two spinning current contacts, M being a positive integer.

13. The vertical Hall sensor according to claim 1, wherein the two spinning current contact functioning as sense contacts during the first operating phase are connected to a pair of nodes configured to be connected to a voltage sensing element during the first operating phase and are connected to another pair of nodes configured to be connected to a voltage or current supply during the second operating phase together with one of the supply-only contacts.

14. A vertical Hall sensor, comprising:
a Hall effect region having a first end and a second end and being symmetric with respect to a symmetry axis such that the first and second ends are mirror-inverted to each other with respect to the symmetry axis;
a plurality of contacts formed in or on a surface of the Hall effect region in a symmetrical manner with respect to the symmetry axis, the contacts being arranged in a sequence along a path extending between the first end and the second end of the Hall effect region;
wherein the plurality of contacts comprises at least four spinning current contacts and at least two supply-only contacts;
wherein the spinning current contacts are configured to alternatingly function as supply contacts and sense contacts according to a spinning current operation;
wherein the at least four spinning current contacts are closer to the symmetry axis than the supply-only contacts;
wherein the at least two supply-only contacts are configured to supply electrical energy to the Hall effect region such that boundary effects affecting an electric current flow within the Hall effect region are reduced, the boundary effects being caused by at least one of the first and second ends.

15. A magnetic sensing method, comprising:
connecting a power supply between a spinning current contact and a supply-only contact, wherein the spinning current contact is configured to alternatingly function as a supply contact and a sense contact according to a spinning current operation, wherein the spinning current contact and the supply-only contact belong to a plurality of contacts formed in or on the surface of a Hall effect region of a vertical Hall sensor comprising at least four spinning current contacts and at least two supply-only contacts, the contacts being arranged in a sequence along a path extending between a first end and a second end of the Hall effect region, wherein the at least four spinning current contacts are arranged along a central portion of the path, and wherein the at least two supply-only contacts are arranged on both sides of the central portion in a distributed manner and are configured to supply electrical energy to the Hall effect region for supplying electrical energy to the Hall effect region;
sensing a sense signal between at least two spinning current contacts currently functioning as sense contacts;
swapping the functions of the spinning current contacts so that the electrical energy is now supplied to the Hall effect region via one of the spinning current contacts having previously functioned as sense contacts and at least one other supply-only contact different from the supply-only contact used previously;
sensing a sense signal between two spinning current contacts other than the ones used previously; and
determining an output signal based on the sense signals.

16. The magnetic sensing method according to claim 15, wherein determining the output signal comprises multiplying at least one of the sense signals with ±1 and at least one of adding, averaging, and low-pass filtering two or more sense signals.

17. The magnetic sensing method according to claim 15, further comprising:
switching at least one switching element connected to at least one of the supply-only contacts so that the at least one supply-only contact is configured to supply electrical energy to the Hall effect region during at least one operating phase of the spinning current operation and to function as a floating contact during at least one other operating phase of the spinning current operation.

18. A vertical Hall sensor, comprising:
a Hall effect region; and
a plurality of contacts formed in or on a surface of the Hall effect region, the contacts being arranged in a sequence along a path extending between a first end and a second end of the Hall effect region;
wherein the plurality of contacts comprise at least four spinning current contacts and at least two supply-only contacts;
wherein the spinning current contacts are configured to alternatingly function as supply contacts and sense contacts according to a spinning current operation;
wherein the at least four spinning current contacts are arranged along a central portion of the path;
wherein the at least two supply-only contacts are arranged on opposing sides of the central portion in a distributed manner and are configured to supply electrical energy to the Hall effect region;
wherein a first pair of the at least four spinning current contacts are connected to a first pair of nodes configured to be connected to a voltage or current supply, and a second different pair of the at least four spinning current contacts are connected to a second different pair of nodes configured to be connected to a voltage sensing element during a first operating phase of the spinning current operation; and
wherein the first pair of the spinning current contacts are connected to the second pair of nodes, and the second pair of the current contacts are connected to the first pair of nodes during a second operation phase of the spinning current operation.

19. The vertical Hall sensor according to claim 18, wherein the at least two supply-only contacts are floated during the first and second operation phases of the spinning current operation.

20. The vertical Hall sensor according to claim 18, wherein the Hall effect region is elongated and has one of a straight shape, a curved shape, an angled shape, an L-shape, an arched shape, and a piece-wise straight shape.

21. The vertical Hall sensor according to claim 18, wherein the plurality of contacts comprises at least four of the supply-only contacts so that during at least two operating phases of the spinning current operation at least one supply-only contact at each side of the central portion is configured to supply electrical energy to the Hall effect region.

22. The vertical Hall sensor according to claim 18, wherein the at least two supply-only contacts comprise two outermost supply-only contacts that are spaced apart from the first end and the second end by a distance greater than a maximal spacing of the at least four spinning current contacts.

23. The vertical Hall device according to claim 18, wherein a length of the Hall effect region is greater than a length of the central portion by a factor comprised in a range between 1.2 and 20.

24. The vertical Hall sensor according to claim 18, wherein one of the at least two supply-only contacts is configured to be connected to the voltage or current supply together with the first pair of the at least four spinning current contacts during the first operating phase, and wherein the other of the at least two supply-only contacts is configured to be connected to the voltage or current supply together with the second different pair of the at least four spinning current contacts during the second operating phase of the spinning current operation.

\* \* \* \* \*